US009929745B2

(12) United States Patent
Rubanovich et al.

(10) Patent No.: US 9,929,745 B2
(45) Date of Patent: Mar. 27, 2018

(54) APPARATUS AND METHOD FOR VECTOR COMPRESSION

(71) Applicant: INTEL CORPORATION, Santa Clara, CA (US)

(72) Inventors: Simon Rubanovich, Haifa (IL); David M. Russinoff, Austin, TX (US); Amit Gradstein, Binyamina (IL); John W. O'Leary, Portland, OR (US); Zeev Sperber, Zichron Yackov (IL)

(73) Assignee: Intel Corporation, Santa Clara, CA (US)

( * ) Notice: Subject to any disclaimer, the term of this patent is extended or adjusted under 35 U.S.C. 154(b) by 273 days.

(21) Appl. No.: 14/499,038

(22) Filed: Sep. 26, 2014

(65) Prior Publication Data

US 2016/0094241 A1 Mar. 31, 2016

(51) Int. Cl.
| | |
|---|---|
| *G06F 9/315* | (2006.01) |
| *G06F 15/76* | (2006.01) |
| *H03M 7/30* | (2006.01) |
| *G06F 9/30* | (2018.01) |
| *G06F 15/80* | (2006.01) |

(52) U.S. Cl.
CPC ...... *H03M 7/3066* (2013.01); *G06F 9/30018* (2013.01); *G06F 9/30032* (2013.01); *G06F 9/30036* (2013.01); *G06F 15/8053* (2013.01); *G06F 15/8084* (2013.01)

(58) Field of Classification Search
CPC ............. G06F 9/30032; G06F 9/30036; G06F 9/30018; G06F 15/8007; G06F 15/8053; G06F 15/8084; H03M 7/3066

USPC ........................................ 712/5, 7, 223, 224
See application file for complete search history.

(56) References Cited

U.S. PATENT DOCUMENTS

| | | | | |
|---|---|---|---|---|
| 6,446,198 B1 * | 9/2002 | Sazegari | ................. | G06F 7/764 712/300 |
| 7,516,299 B2 * | 4/2009 | Citron | ................. | G06F 9/30032 712/22 |
| 8,291,002 B2 * | 10/2012 | Craske | ...................... | G06F 5/00 708/209 |
| 2003/0105945 A1 * | 6/2003 | Wolff | ................. | G06F 9/30018 712/224 |

* cited by examiner

*Primary Examiner* — Daniel H Pan
(74) *Attorney, Agent, or Firm* — Nicholson De Vos Webster & Elliot LLP

(57) ABSTRACT

An apparatus and method are described for performing vector compression. For example, one embodiment of a processor comprises: vector compression logic to compress a source vector comprising a plurality of valid data elements and invalid data elements to generate a destination vector in which valid data elements are stored contiguously on one side of the destination vector, the vector compression logic to utilize a bit mask associated with the source vector and comprising a plurality of bits, each bit corresponding to one of the plurality of data elements of the source vector and indicating whether the data element comprises a valid data element or an invalid data element, the vector compression logic to utilize indices of the bit mask and associated bit values of the bit mask to generate a control vector; and shuffle logic to shuffle/permute the data elements of the source vector to the destination vector in accordance with the control vector.

26 Claims, 20 Drawing Sheets

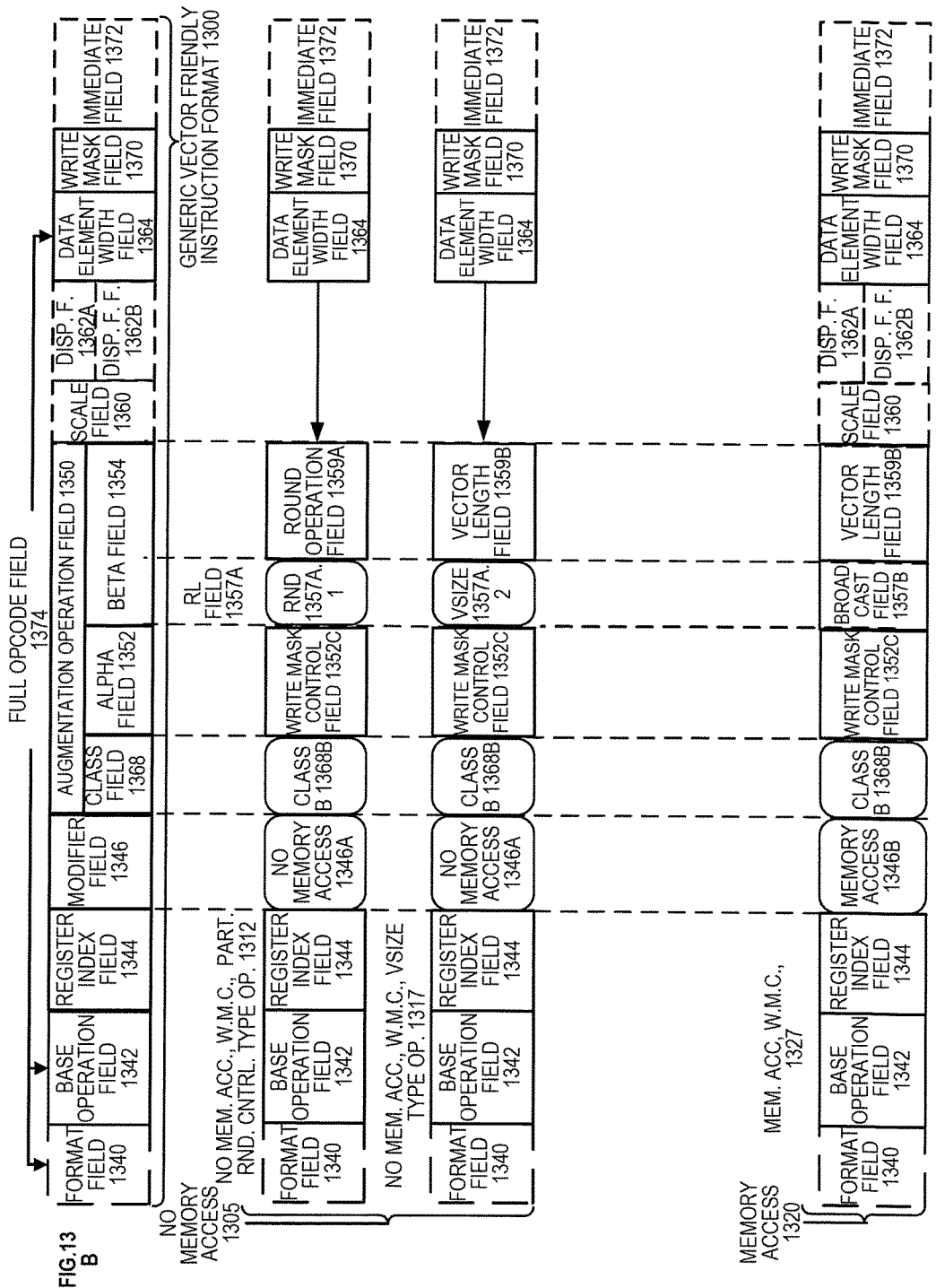

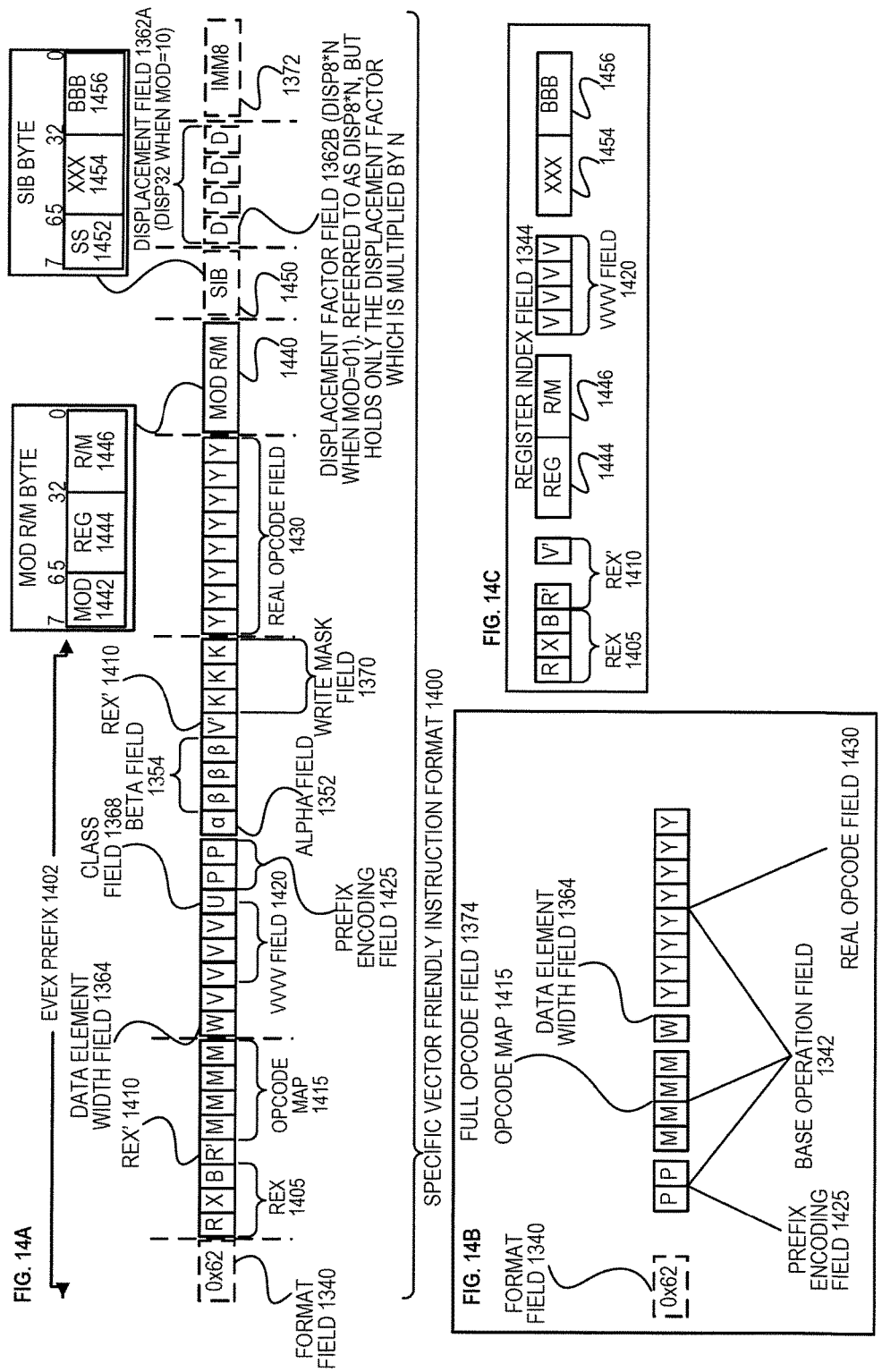

FIG. 15
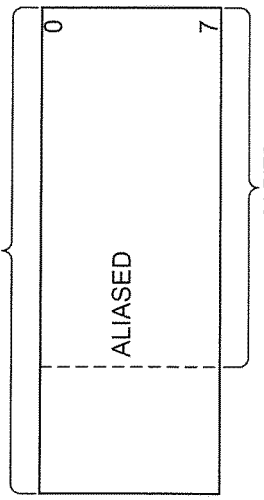
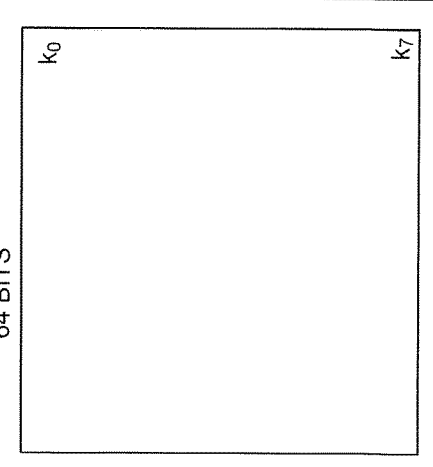
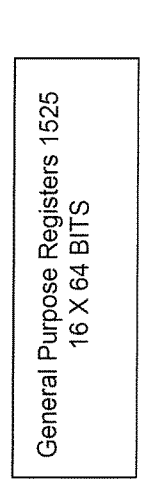
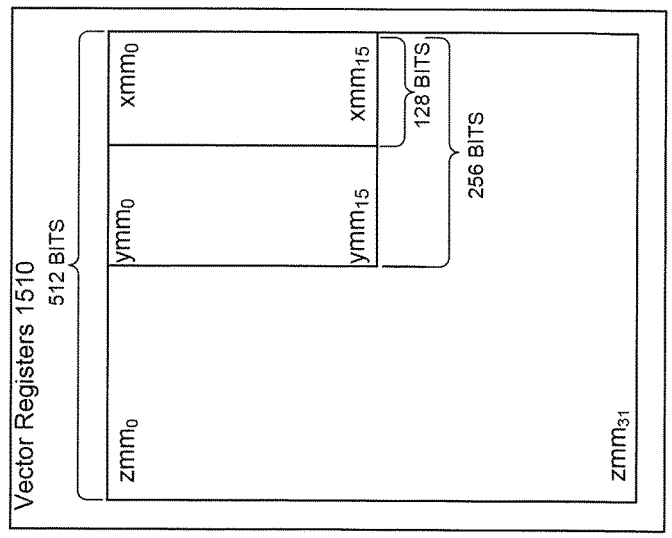

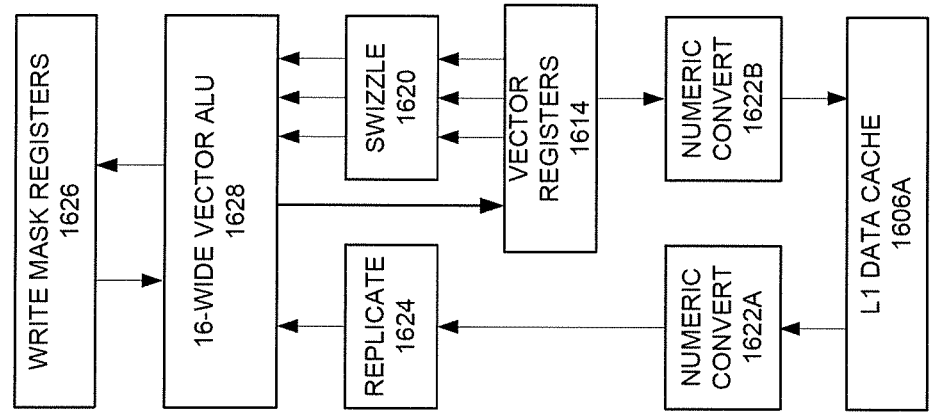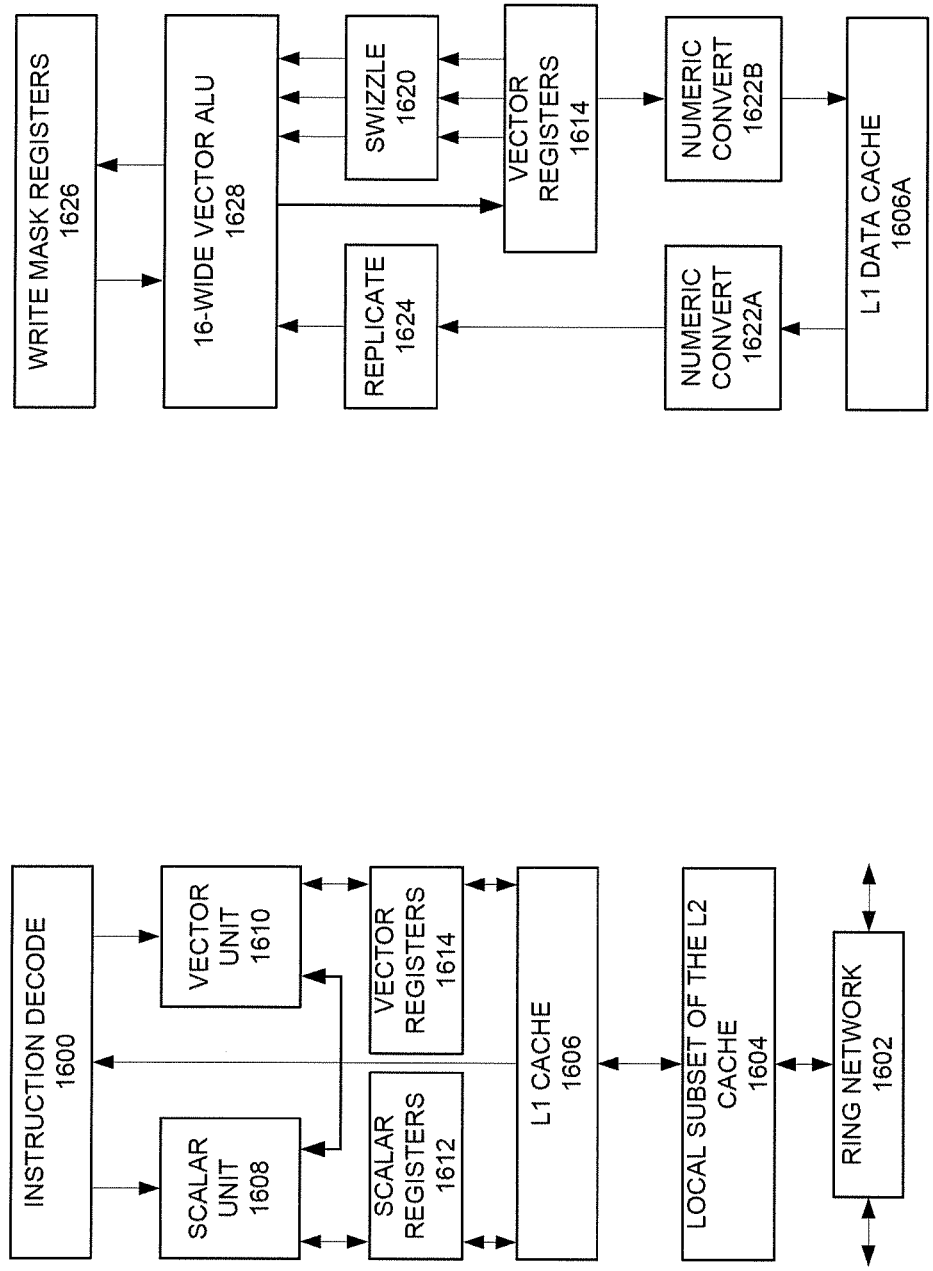

APPARATUS AND METHOD FOR VECTOR COMPRESSION

FIELD OF THE INVENTION

Embodiments of the invention relate generally to the field of computer systems. More particularly, the embodiments of the invention relate to an apparatus and method for performing vector compression within a computer processor.

BACKGROUND

Certain types of applications often require the same operation to be performed on a large number of data items (referred to as "data parallelism"). Single Instruction Multiple Data (SIMD) refers to a type of instruction that causes a processor to perform an operation on multiple data items. SIMD technology is especially suited to processors that can logically divide the bits in a register into a number of fixed-sized data elements, each of which represents a separate value. For example, the bits in a 256-bit register may be specified as a source operand to be operated on as four separate 64-bit packed data elements (quad-word (Q) size data elements), eight separate 32-bit packed data elements (double word (D) size data elements), sixteen separate 16-bit packed data elements (word (W) size data elements), or thirty-two separate 8-bit data elements (byte (B) size data elements). This type of data is referred to as "packed" data type or a "vector" data type, and operands of this data type are referred to as packed data operands or vector operands. In other words, a packed data item or vector refers to a sequence of packed data elements, and a packed data operand or a vector operand is a source or destination operand of a SIMD instruction (also known as a packed data instruction or a vector instruction).

The SIMD technology, such as that employed by the Intel® Core™ processors having an instruction set including x86, MMX™, Streaming SIMD Extensions (SSE), SSE2, SSE3, SSE4.1, and SSE4.2 instructions, has enabled a significant improvement in application performance. An additional set of SIMD extensions, referred to the Advanced Vector Extensions (AVX) (AVX1 and AVX2) and using the Vector Extensions (VEX) coding scheme, has been released (see, e.g., see Intel® 64 and IA-32 Architectures Software Developers Manual, October 2011; and see Intel® Advanced Vector Extensions Programming Reference, June 2011).

Compression problems arise then not all results of SIMD/vector calculations are valid. In such cases, it is desirable to compress the valid results so that they go one after another in the same order as in the original vector before being saved to memory. The most prominent example of such a vector is 512-bit width vector in which every byte is a result of calculations and a 64-bit mask shows which byte is valid. For example, if the corresponding bit of the mask is one, then the byte is valid and if the corresponding bit of the mask is zero, then the byte is invalid. It would be beneficial in such cases to "compress" all of the valid results into contiguous storage locations prior to saving the results to memory (e.g., placing all of the valid results together on one side of the register and discarding the invalid results).

BRIEF DESCRIPTION OF THE DRAWINGS

A better understanding of the present invention can be obtained from the following detailed description in conjunction with the following drawings, in which:

FIGS. 13A and 13B are block diagrams illustrating a generic vector friendly instruction format and instruction templates thereof according to embodiments of the invention;

FIGS. 14A-D is a block diagram illustrating an exemplary specific vector friendly instruction format according to embodiments of the invention;

FIG. 15 is a block diagram of a register architecture according to one embodiment of the invention; and FIGS. 16A-B illustrate a block diagram of a more specific exemplary in-order core architecture.

DETAILED DESCRIPTION

Exemplary Processor Architectures

Figure 1:
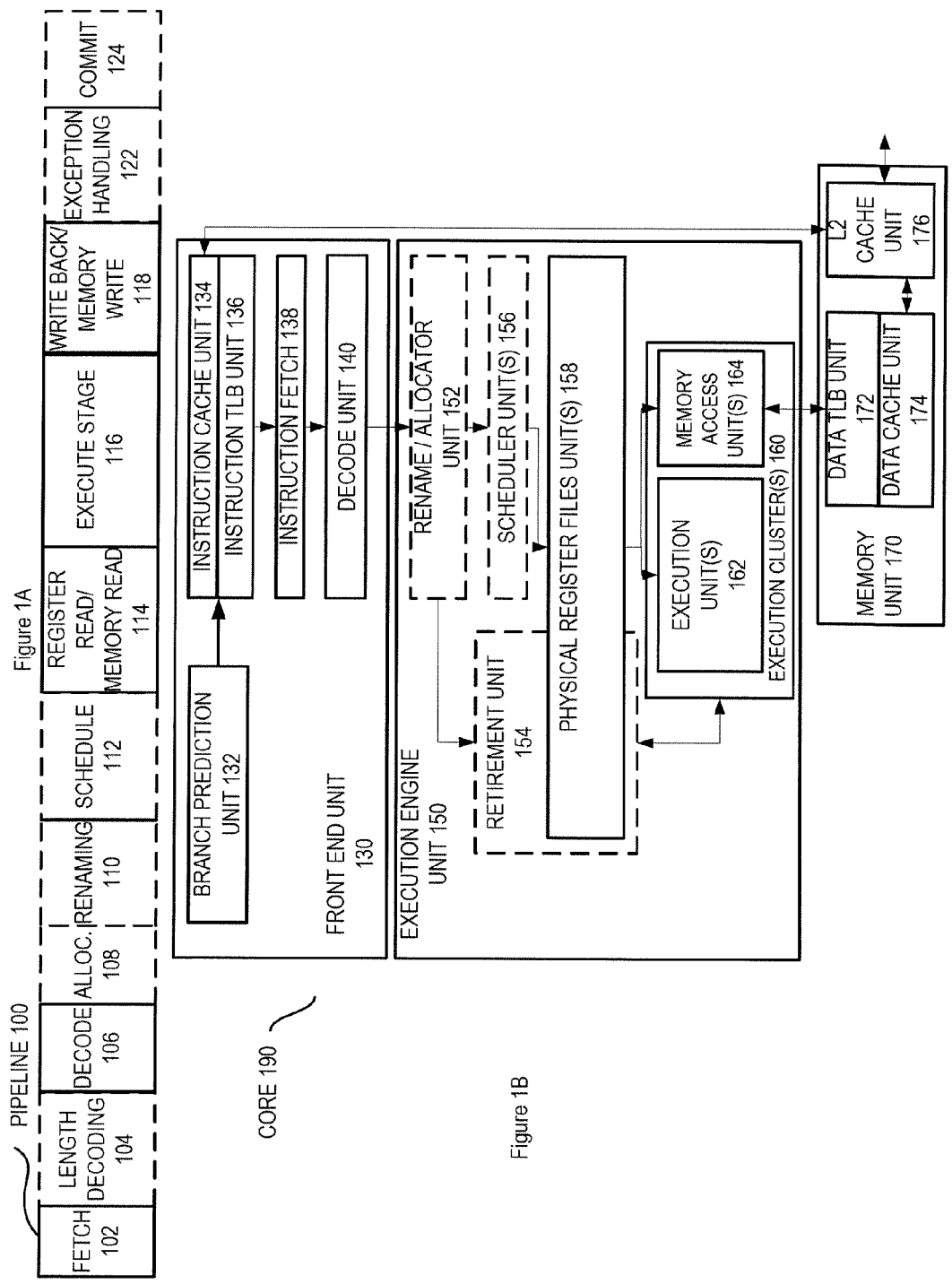
FIG. 1A is a block diagram illustrating both an exemplary in-order pipeline and an exemplary register renaming, out-of-order issue/execution pipeline according to embodiments of the invention.
FIG. 1B is a block diagram illustrating both an exemplary embodiment of an in-order architecture core and an exemplary register renaming, out-of-order issue/execution architecture core to be included in a processor according to embodiments of the invention.

FIG. 1A is a block diagram illustrating both an exemplary in-order fetch, decode, retire pipeline and an exemplary register renaming, out-of-order issue/execution pipeline according to embodiments of the invention. FIG. 1B is a block diagram illustrating both an exemplary embodiment of an in-order fetch, decode, retire core and an exemplary register renaming, out-of-order issue/execution architecture core to be included in a processor according to embodiments of the invention. The solid lined boxes in FIGS. 1A-B illustrate the in-order portions of the pipeline and core, while the optional addition of the dashed lined boxes illustrates the register renaming, out-of-order issue/execution pipeline and core.

In FIG. 1A, a processor pipeline 100 includes a fetch stage 102, a length decode stage 104, a decode stage 106, an allocation stage 108, a renaming stage 110, a scheduling (also known as a dispatch or issue) stage 112, a register read/memory read stage 114, an execute stage 116, a write back/memory write stage 118, an exception handling stage 122, and a commit stage 124.

FIG. 1B shows processor core 190 including a front end unit 130 coupled to an execution engine unit 150, and both are coupled to a memory unit 170. The core 190 may be a reduced instruction set computing (RISC) core, a complex instruction set computing (CISC) core, a very long instruction word (VLIW) core, or a hybrid or alternative core type. As yet another option, the core 190 may be a special-purpose core, such as, for example, a network or communication core, compression engine, coprocessor core, general purpose computing graphics processing unit (GPGPU) core, graphics core, or the like.

The front end unit 130 includes a branch prediction unit 132 coupled to an instruction cache unit 134, which is coupled to an instruction translation lookaside buffer (TLB) 136, which is coupled to an instruction fetch unit 138, which is coupled to a decode unit 140. The decode unit 140 (or decoder) may decode instructions, and generate as an output one or more micro-operations, micro-code entry points, microinstructions, other instructions, or other control signals, which are decoded from, or which otherwise reflect, or are derived from, the original instructions. The decode unit 140 may be implemented using various different mechanisms. Examples of suitable mechanisms include, but are not limited to, look-up tables, hardware implementations, programmable logic arrays (PLAs), microcode read only memories (ROMs), etc. In one embodiment, the core 190 includes a microcode ROM or other medium that stores microcode for certain macroinstructions (e.g., in decode unit 140 or otherwise within the front end unit 130). The decode unit 140 is coupled to a rename/allocator unit 152 in the execution engine unit 150.

The execution engine unit 150 includes the rename/allocator unit 152 coupled to a retirement unit 154 and a set of one or more scheduler unit(s) 156. The scheduler unit(s) 156 represents any number of different schedulers, including reservations stations, central instruction window, etc. The scheduler unit(s) 156 is coupled to the physical register file(s) unit(s) 158. Each of the physical register file(s) units 158 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 158 comprises a vector registers unit, a write mask registers unit, and a scalar registers unit. These register units may provide architectural vector registers, vector mask registers, and general purpose registers. The physical register file(s) unit(s) 158 is overlapped by the retirement unit 154 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 154 and the physical register file(s) unit(s) 158 are coupled to the execution cluster(s) 160. The execution cluster(s) 160 includes a set of one or more execution units 162 and a set of one or more memory access units 164. The execution units 162 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 156, physical register file(s) unit(s) 158, and execution cluster(s) 160 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 164). It should also be understood that where separate pipelines are used, one or more of these pipelines may be out-of-order issue/execution and the rest in-order.

The set of memory access units 164 is coupled to the memory unit 170, which includes a data TLB unit 172 coupled to a data cache unit 174 coupled to a level 2 (L2) cache unit 176. In one exemplary embodiment, the memory access units 164 may include a load unit, a store address unit, and a store data unit, each of which is coupled to the data TLB unit 172 in the memory unit 170. The instruction cache unit 134 is further coupled to a level 2 (L2) cache unit 176 in the memory unit 170. The L2 cache unit 176 is coupled to one or more other levels of cache and eventually to a main memory.

By way of example, the exemplary register renaming, out-of-order issue/execution core architecture may implement the pipeline 100 as follows: 1) the instruction fetch 138 performs the fetch and length decoding stages 102 and 104; 2) the decode unit 140 performs the decode stage 106; 3) the rename/allocator unit 152 performs the allocation stage 108 and renaming stage 110; 4) the scheduler unit(s) 156 performs the schedule stage 112; 5) the physical register file(s) unit(s) 158 and the memory unit 170 perform the register read/memory read stage 114; the execution cluster 160 perform the execute stage 116; 6) the memory unit 170 and the physical register file(s) unit(s) 158 perform the write back/memory write stage 118; 7) various units may be involved in the exception handling stage 122; and 8) the retirement unit 154 and the physical register file(s) unit(s) 158 perform the commit stage 124.

The core 190 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 190 includes logic to support a packed data instruction set extension (e.g., AVX1, AVX2, and/or some form of the generic vector friendly instruction format (U=0 and/or U=1), described below), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 134/174 and a shared L2 cache unit 176, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 2:
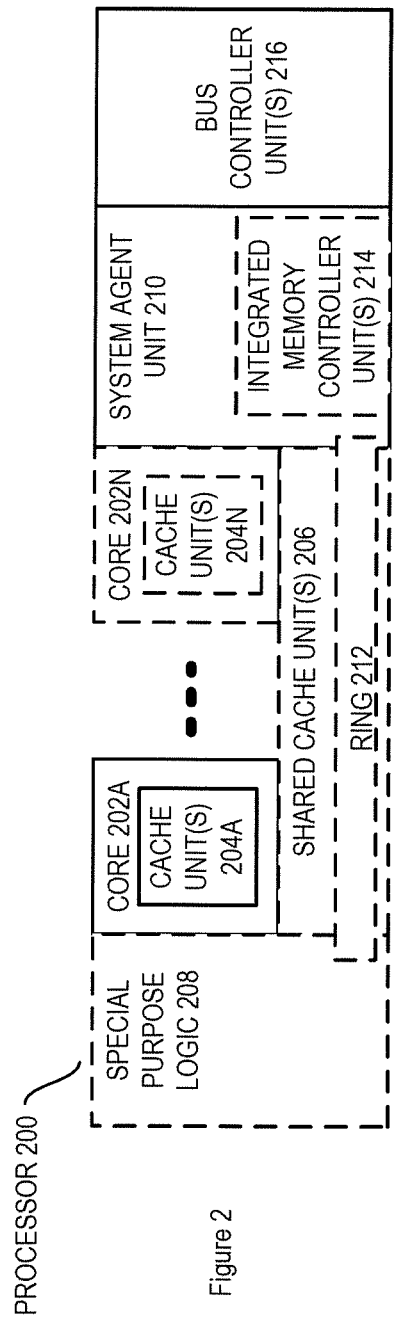
FIG. 2 is a block diagram of a single core processor and a multicore processor with integrated memory controller and graphics according to embodiments of the invention.

FIG. 2 is a block diagram of a processor 200 that may have more than one core, may have an integrated memory controller, and may have integrated graphics according to embodiments of the invention. The solid lined boxes in FIG. 2 illustrate a processor 200 with a single core 202A, a system agent 210, a set of one or more bus controller units 216, while the optional addition of the dashed lined boxes illustrates an alternative processor 200 with multiple cores 202A-N, a set of one or more integrated memory controller unit(s) 214 in the system agent unit 210, and special purpose logic 208.

Thus, different implementations of the processor 200 may include: 1) a CPU with the special purpose logic 208 being integrated graphics and/or scientific (throughput) logic (which may include one or more cores), and the cores 202A-N being one or more general purpose cores (e.g., general purpose in-order cores, general purpose out-of-order cores, a combination of the two); 2) a coprocessor with the cores 202A-N being a large number of special purpose cores intended primarily for graphics and/or scientific (throughput); and 3) a coprocessor with the cores 202A-N being a large number of general purpose in-order cores. Thus, the processor 200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 206, and external memory (not shown) coupled to the set of integrated memory controller units 214. The set of shared cache units 206 may include one or more mid-level caches, such as level 2 (L2), level 3 (L3), level 4 (L4), or other levels of cache, a last level cache (LLC), and/or combinations thereof. While in one embodiment a ring based interconnect unit 212 interconnects the integrated graphics logic 208, the set of shared cache units 206, and the system agent unit 210/integrated memory controller unit(s) 214, alternative embodiments may use any number of well-known techniques for interconnecting such units. In one embodiment, coherency is maintained between one or more cache units 206 and cores 202-A-N.

In some embodiments, one or more of the cores 202A-N are capable of multi-threading. The system agent 210 includes those components coordinating and operating cores 202A-N. The system agent unit 210 may include for example a power control unit (PCU) and a display unit. The PCU may be or include logic and components needed for regulating the power state of the cores 202A-N and the integrated graphics logic 208. The display unit is for driving one or more externally connected displays.

The cores 202A-N may be homogenous or heterogeneous in terms of architecture instruction set; that is, two or more of the cores 202A-N may be capable of execution the same instruction set, while others may be capable of executing only a subset of that instruction set or a different instruction set. In one embodiment, the cores 202A-N are heterogeneous and include both the "small" cores and "big" cores described below.

FIGS. 3-6 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 3:
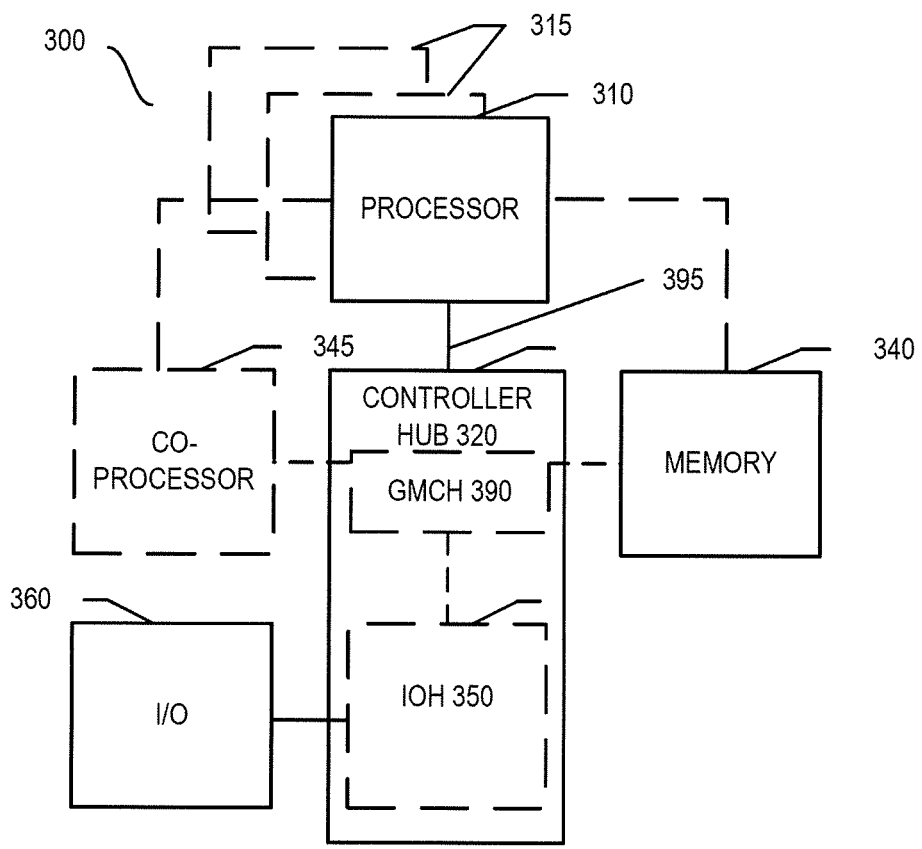
FIG. 3 illustrates a block diagram of a system in accordance with one embodiment of the present invention.

Referring now to FIG. 3, shown is a block diagram of a system 300 in accordance with one embodiment of the present invention. The system 300 may include one or more processors 310, 315, which are coupled to a controller hub 320. In one embodiment the controller hub 320 includes a graphics memory controller hub (GMCH) 390 and an Input/Output Hub (IOH) 350 (which may be on separate chips); the GMCH 390 includes memory and graphics controllers to which are coupled memory 340 and a coprocessor 345; the IOH 350 is couples input/output (I/O) devices 360 to the GMCH 390. Alternatively, one or both of the memory and graphics controllers are integrated within the processor (as described herein), the memory 340 and the coprocessor 345 are coupled directly to the processor 310, and the controller hub 320 in a single chip with the IOH 350.

The optional nature of additional processors 315 is denoted in FIG. 3 with broken lines. Each processor 310, 315 may include one or more of the processing cores described herein and may be some version of the processor 200.

The memory 340 may be, for example, dynamic random access memory (DRAM), phase change memory (PCM), or a combination of the two. For at least one embodiment, the controller hub 320 communicates with the processor(s) 310, 315 via a multi-drop bus, such as a frontside bus (FSB), point-to-point interface such as QuickPath Interconnect (QPI), or similar connection 395.

In one embodiment, the coprocessor 345 is a special-purpose processor, such as, for example, a high-throughput MIC processor, a network or communication processor, compression engine, graphics processor, GPGPU, embedded processor, or the like. In one embodiment, controller hub 320 may include an integrated graphics accelerator.

There can be a variety of differences between the physical resources 310, 315 in terms of a spectrum of metrics of merit including architectural, microarchitectural, thermal, power consumption characteristics, and the like.

In one embodiment, the processor 310 executes instructions that control data processing operations of a general type. Embedded within the instructions may be coprocessor instructions. The processor 310 recognizes these coprocessor instructions as being of a type that should be executed by the attached coprocessor 345. Accordingly, the processor 310 issues these coprocessor instructions (or control signals representing coprocessor instructions) on a coprocessor bus or other interconnect, to coprocessor 345. Coprocessor(s) 345 accept and execute the received coprocessor instructions.

Figure 4:
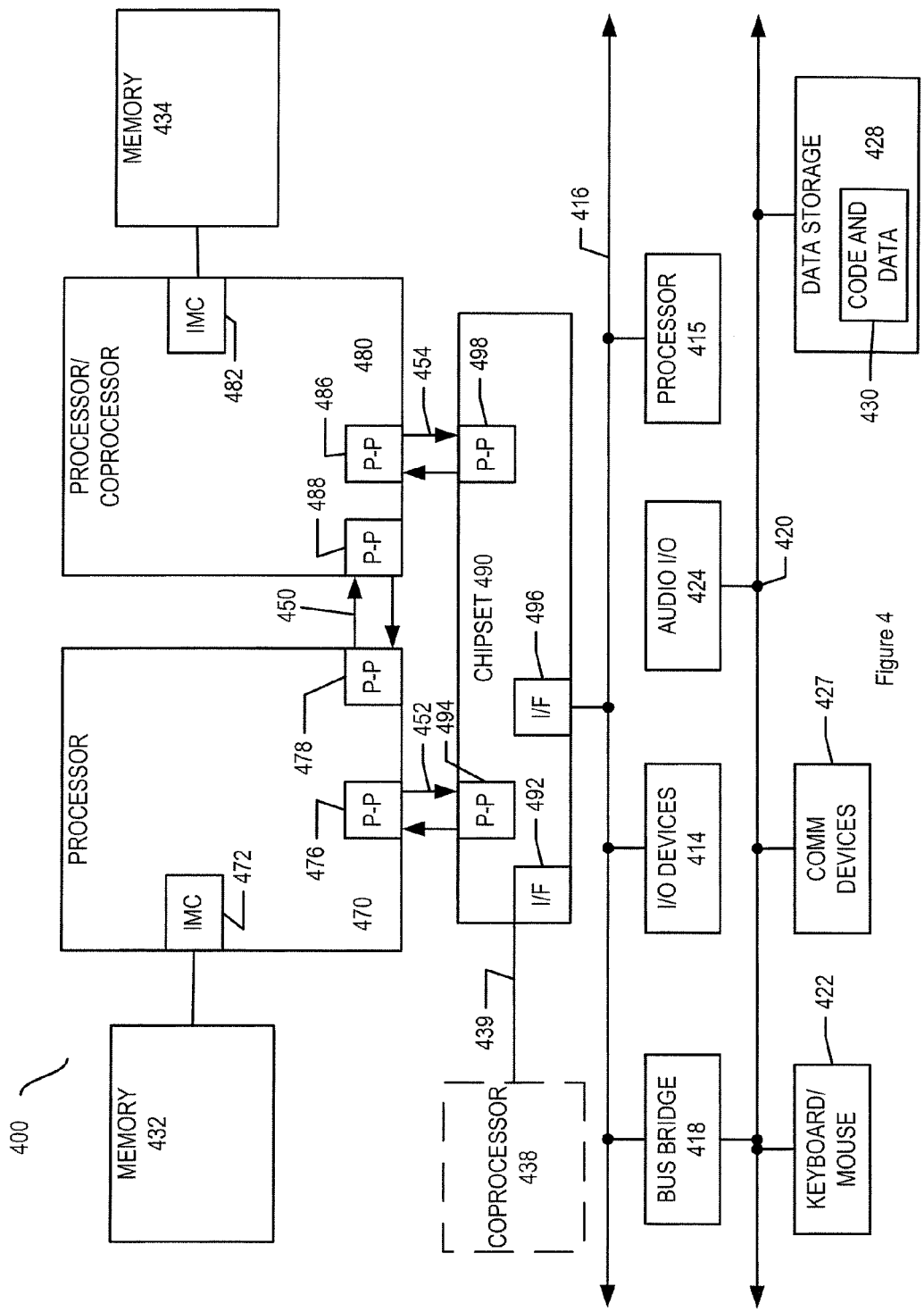
FIG. 4 illustrates a block diagram of a second system in accordance with an embodiment of the present invention.

Referring now to FIG. 4, shown is a block diagram of a first more specific exemplary system 400 in accordance with an embodiment of the present invention. As shown in FIG. 4, multiprocessor system 400 is a point-to-point interconnect system, and includes a first processor 470 and a second processor 480 coupled via a point-to-point interconnect 450. Each of processors 470 and 480 may be some version of the processor 200. In one embodiment of the invention, processors 470 and 480 are respectively processors 310 and 315, while coprocessor 438 is coprocessor 345. In another embodiment, processors 470 and 480 are respectively processor 310 coprocessor 345.

Processors 470 and 480 are shown including integrated memory controller (IMC) units 472 and 482, respectively. Processor 470 also includes as part of its bus controller units point-to-point (P-P) interfaces 476 and 478; similarly, second processor 480 includes P-P interfaces 486 and 488. Processors 470, 480 may exchange information via a point-to-point (P-P) interface 450 using P-P interface circuits 478, 488. As shown in FIG. 4, IMCs 472 and 482 couple the processors to respective memories, namely a memory 432 and a memory 434, which may be portions of main memory locally attached to the respective processors.

Processors 470, 480 may each exchange information with a chipset 490 via individual P-P interfaces 452, 454 using point to point interface circuits 476, 494, 486, 498. Chipset 490 may optionally exchange information with the coprocessor 438 via a high-performance interface 439. In one embodiment, the coprocessor 438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 490 may be coupled to a first bus 416 via an interface 496. In one embodiment, first bus 416 may be a Peripheral Component Interconnect (PCI) bus, or a bus such as a PCI Express bus or another third generation I/O interconnect bus, although the scope of the present invention is not so limited.

As shown in FIG. 4, various I/O devices 414 may be coupled to first bus 416, along with a bus bridge 418 which couples first bus 416 to a second bus 420. In one embodiment, one or more additional processor(s) 415, such as coprocessors, high-throughput MIC processors, GPGPU's, accelerators (such as, e.g., graphics accelerators or digital signal processing (DSP) units), field programmable gate arrays, or any other processor, are coupled to first bus 416. In one embodiment, second bus 420 may be a low pin count (LPC) bus. Various devices may be coupled to a second bus 420 including, for example, a keyboard and/or mouse 422, communication devices 427 and a storage unit 428 such as a disk drive or other mass storage device which may include instructions/code and data 430, in one embodiment. Further, an audio I/O 424 may be coupled to the second bus 420. Note that other architectures are possible. For example, instead of the point-to-point architecture of FIG. 4, a system may implement a multi-drop bus or other such architecture.

Figure 5:
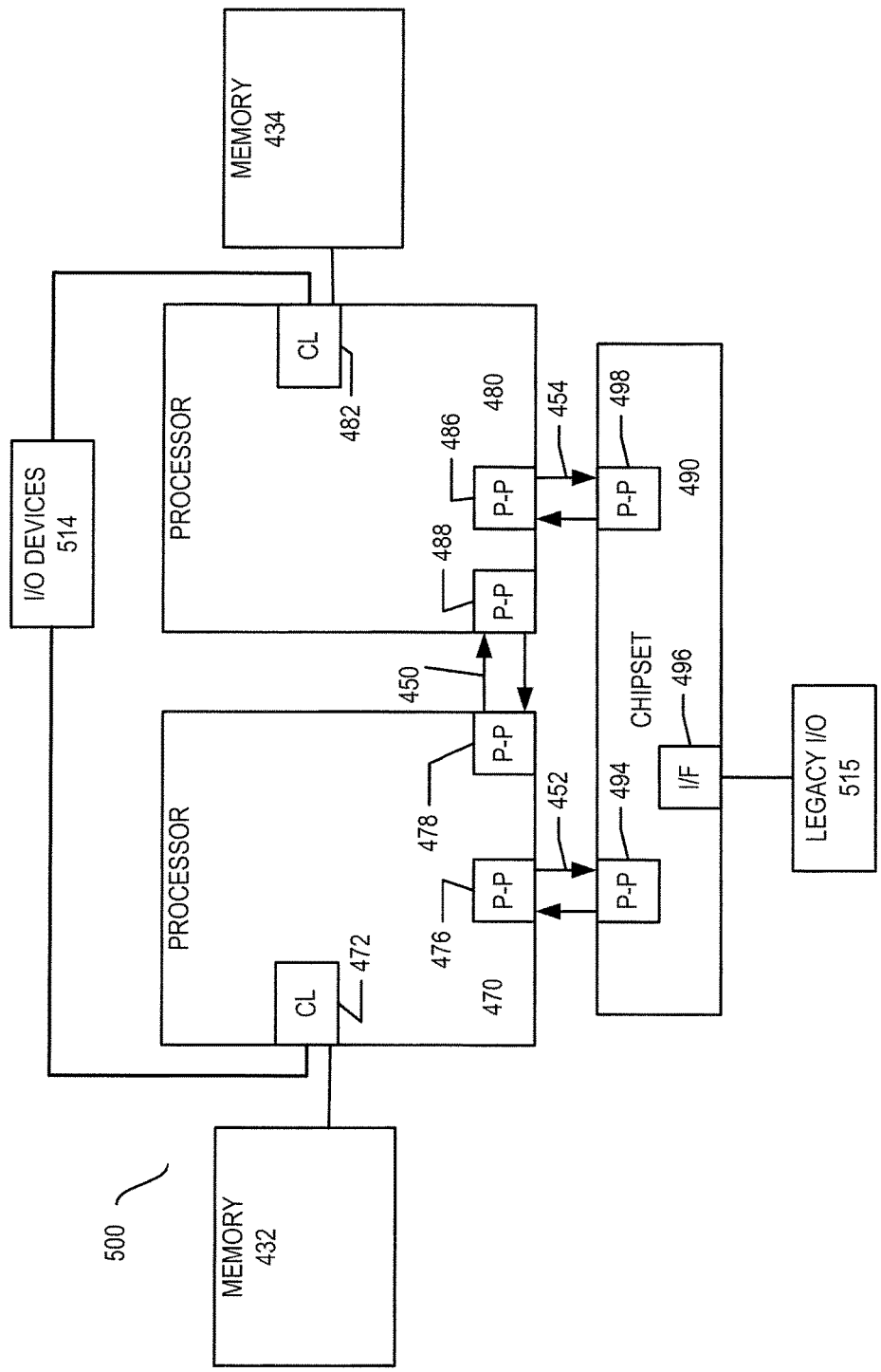
FIG. 5 illustrates a block diagram of a third system in accordance with an embodiment of the present invention.

Referring now to FIG. 5, shown is a block diagram of a second more specific exemplary system 500 in accordance with an embodiment of the present invention. Like elements in FIGS. 4 and 5 bear like reference numerals, and certain aspects of FIG. 4 have been omitted from FIG. 5 in order to avoid obscuring other aspects of FIG. 5.

FIG. 5 illustrates that the processors 470, 480 may include integrated memory and I/O control logic ("CL") 472 and 482, respectively. Thus, the CL 472, 482 include integrated memory controller units and include I/O control logic. FIG. 5 illustrates that not only are the memories 432, 434 coupled to the CL 472, 482, but also that I/O devices 514 are also coupled to the control logic 472, 482. Legacy I/O devices 515 are coupled to the chipset 490.

Figure 6:
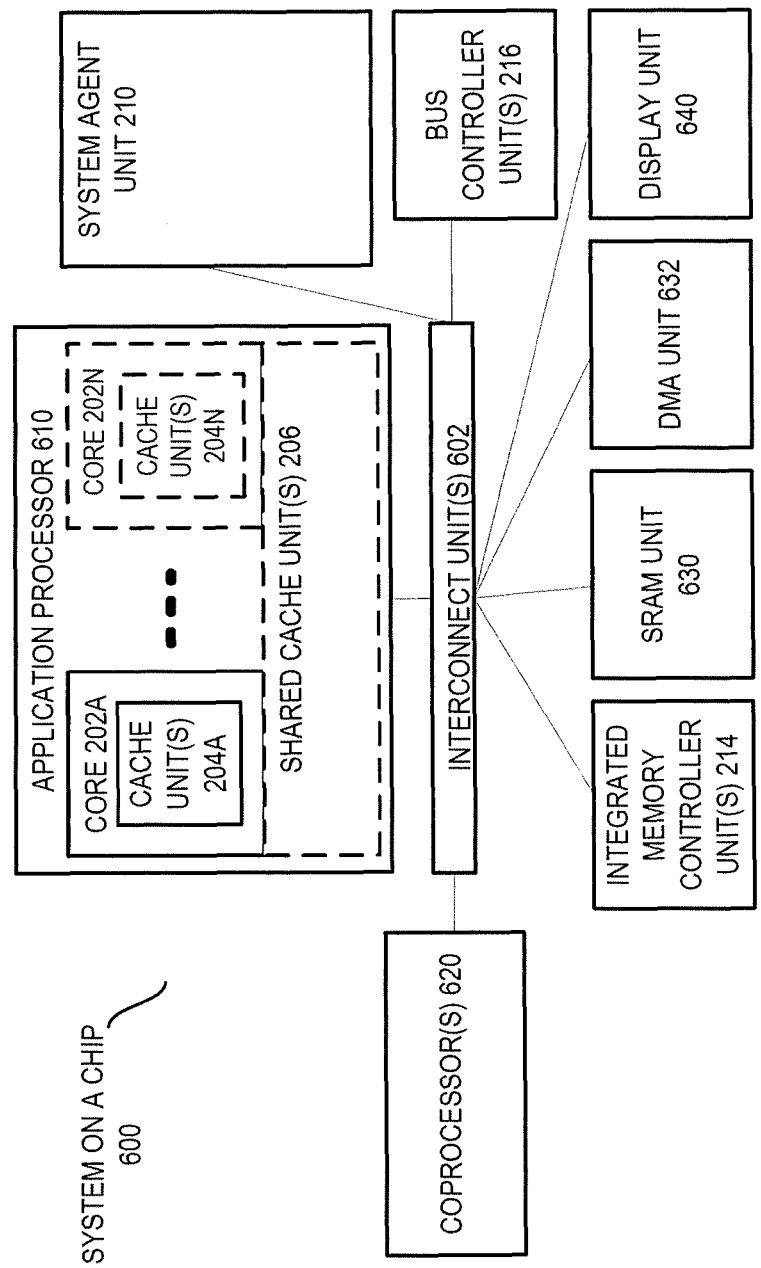
FIG. 6 illustrates a block diagram of a system on a chip (SoC) in accordance with an embodiment of the present invention.

Referring now to FIG. 6, shown is a block diagram of a SoC 600 in accordance with an embodiment of the present invention. Similar elements in FIG. 2 bear like reference numerals. Also, dashed lined boxes are optional features on more advanced SoCs. In FIG. 6, an interconnect unit(s) 602 is coupled to: an application processor 610 which includes a set of one or more cores 202A-N and shared cache unit(s) 206; a system agent unit 210; a bus controller unit(s) 216; an integrated memory controller unit(s) 214; a set or one or more coprocessors 620 which may include integrated graphics logic, an image processor, an audio processor, and a video processor; an static random access memory (SRAM) unit 630; a direct memory access (DMA) unit 632; and a display unit 640 for coupling to one or more external displays. In one embodiment, the coprocessor(s) 620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 430 illustrated in FIG. 4, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 7:
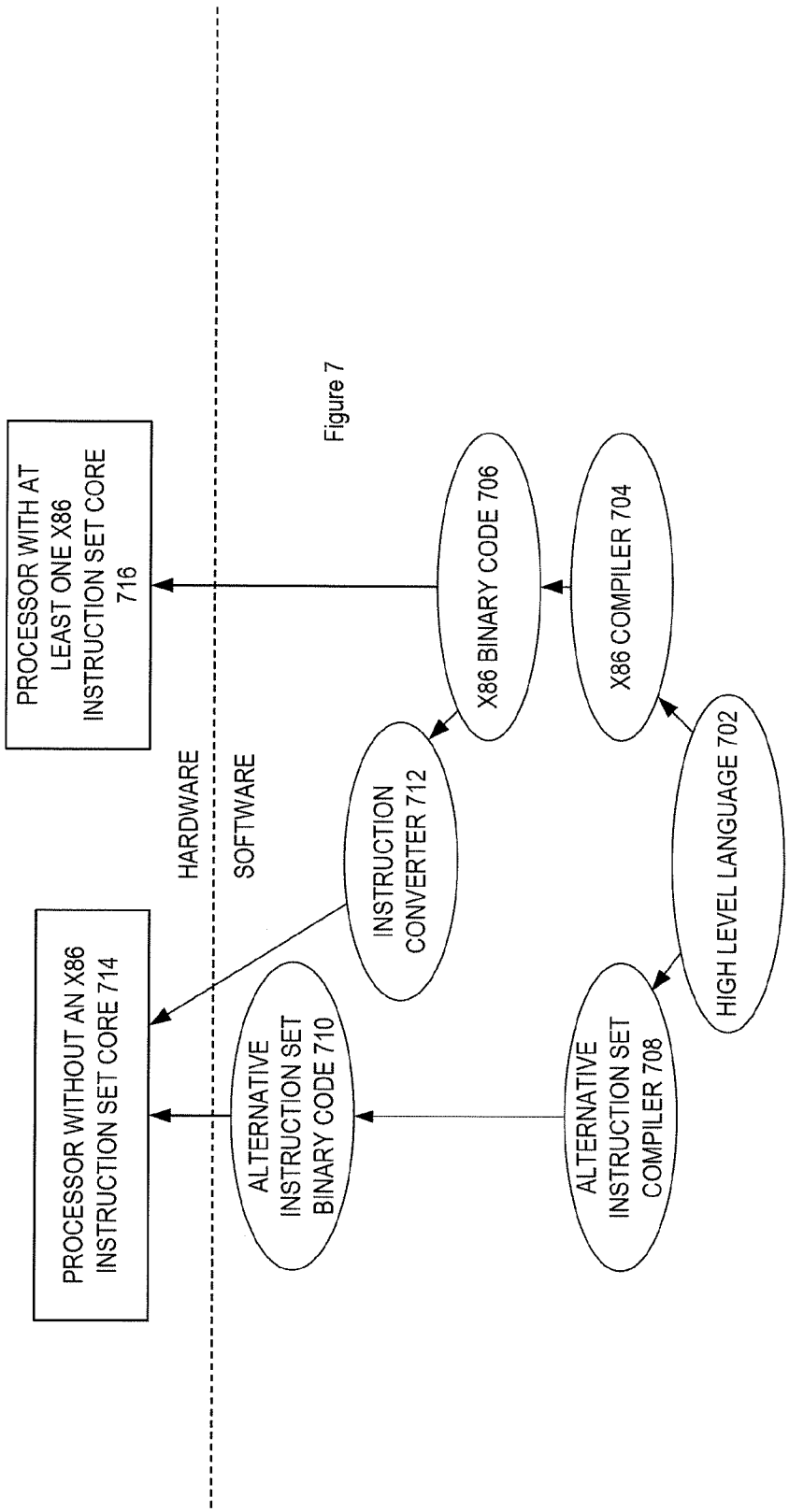
FIG. 7 illustrates a block diagram contrasting the use of a software instruction converter to convert binary instructions in a source instruction set to binary instructions in a target instruction set according to embodiments of the invention.

FIG. 7 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 7 shows a program in a high level language 702 may be compiled using an x86 compiler 704 to generate x86 binary code 706 that may be natively executed by a processor with at least one x86 instruction set core 716. The processor with at least one x86 instruction set core 716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 704 represents a compiler that is operable to generate x86 binary code 706 (e.g., object code) that can, with or without additional linkage processing, be executed on the processor with at least one x86 instruction set core 716.

Similarly, FIG. 7 shows the program in the high level language 702 may be compiled using an alternative instruction set compiler 708 to generate alternative instruction set binary code 710 that may be natively executed by a processor without at least one x86 instruction set core 714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 712 is used to convert the x86 binary code 706 into code that may be natively executed by the processor without an x86 instruction set core 714. This converted code is not likely to be the same as the alternative instruction set binary code 710 because an instruction converter capable of this is difficult to make; however, the converted code will accomplish the general operation and be made up of instructions from the alternative instruction set. Thus, the instruction converter 712 represents software, firmware, hardware, or a combination thereof that, through emulation, simulation or any other process, allows a processor or other electronic device that does not have an x86 instruction set processor or core to execute the x86 binary code 706.

Apparatus and Method for Performing Vector Compression

As mentioned above, when working with vector/SIMD data, there are circumstances where it would be beneficial to compress the vector data to remove invalid data elements. In particular, in one embodiment of the invention, vector compression involves shuffling the data elements such that all valid data elements are stored contiguously on one side of the register. In one embodiment, when a subset of the results of vector calculations are invalid, compression of the valid results is performed such that they are stored contiguously, in the same order as in the original vector before being saved to memory, thereby conserving storage resources.

Figure 8:
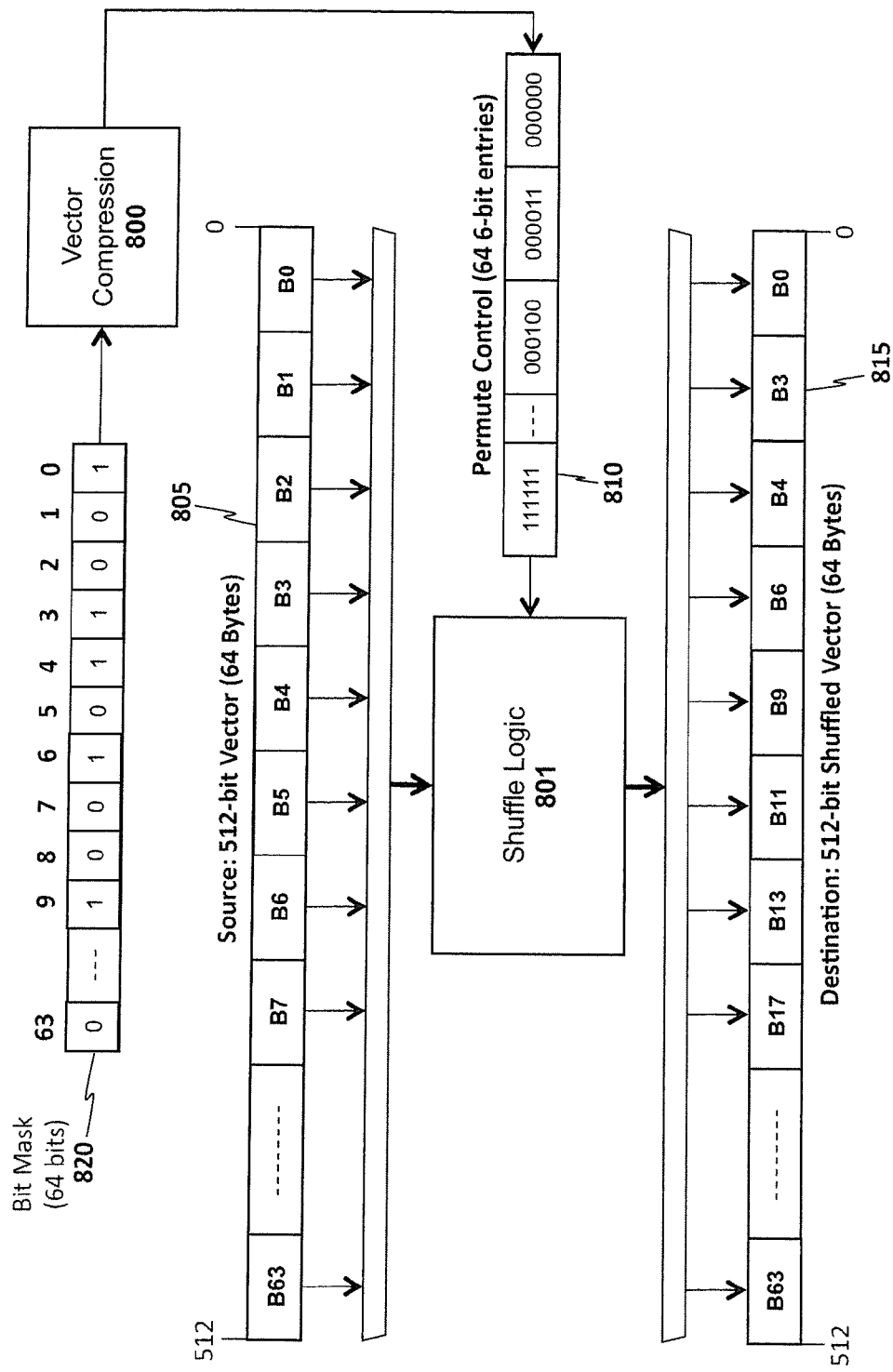
FIG. 8 illustrates logic for performing a shuffle operation in accordance with one embodiment of the invention.
Figure 9:
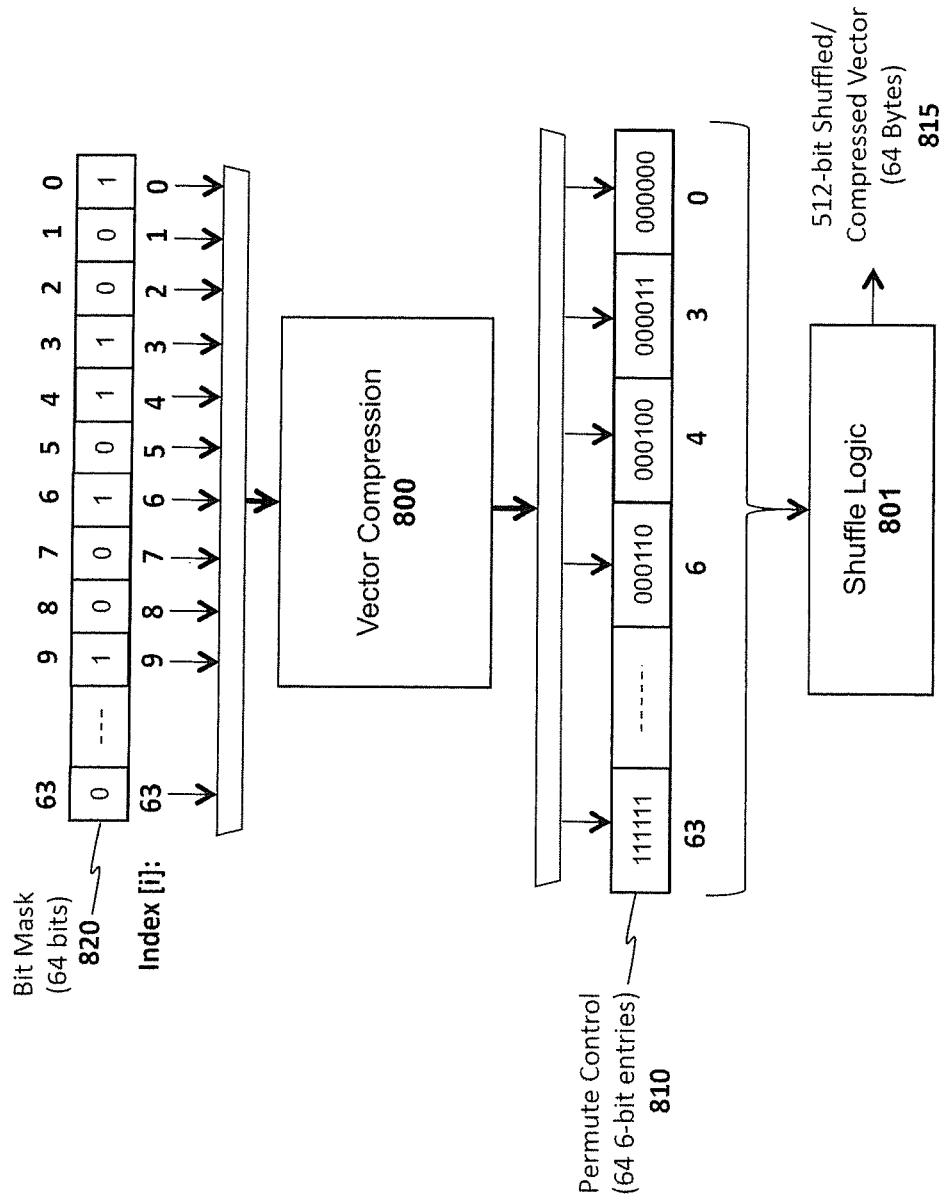
FIG. 9 illustrates logic for performing a vector compression operation in accordance with one embodiment of the invention.

As illustrated in FIGS. 8-9, one embodiment of such a vector is a 512-bit width vector (64 Bytes) 805 in which every byte is a result of calculations and a 64-bit mask 820 shows which bytes are valid (e.g., the corresponding bit of the mask is one for valid results). The goal is to generate a permute control vector 810 to control shuffle logic 801 within the processor such that the shuffle logic 801 will generate a 512-bit shuffled vector (also 64 Bytes) 815 in which all valid bytes are stored in the lower regions (to the right in the example). Thus, in the illustrated embodiment, the shuffle logic 801 is capable of permuting any byte in any location in the source 512-bit vector 805 to any byte location in the destination 512-bit vector. In one embodiment, the permute control vector 810 includes 64 6-bit data elements. The position of each data element in the permute control vector 810 corresponds to a data element within the destination vector 815 (e.g., control data elements 0, 1, 2, etc, of the permute control corresponds to bytes 0, 1, 2, etc, of the destination). The 6-bit value of each data element in the permute control vector 810 identifies the data element from the 64 Byte source vector ($2^6$=64) to be copied to the corresponding data element within the destination vector 815.

As described in detail below, in one embodiment, vector compression logic 800 generates the permute control based on the bit mask 820 to ensure that all valid results are stored contiguously to one side of the destination vector 815. By way of example, as shown in FIG. 9, bits at locations 0, 3, 4, and 6 of the bit mask 820 indicate that the corresponding bytes in byte locations B0, B3, B4, and B6 are valid. As such, it generates a permute control vector 810 in which the first four elements (from right to left in the example) identify bytes B0 (000000), B3 (000011), B4 (000100), and B6 (000110). The end result of the vector compression 800 is a permute control vector 810 in which all control data elements which identify valid bytes in the source vector 805 are stored contiguously towards the right. Consequently, when this permute control vector 810 is used by the shuffle logic 801, the result is that the 64 bytes are stored in the destination vector 815 such that all valid bytes are stored contiguously in the lower regions (to the right in the example).

It should be noted that the specific vector and data element sizes illustrated in FIGS. 8-9 are used merely for the purposes of illustration. The underlying principles of the invention may be implemented using any vector or data element size. Moreover, the compressed vector results may store valid results to either the right or the left while still complying with the underlying principles of the invention.

The specific manner in which the vector compression logic 800 uses the bit mask 820 and its associated index values (identifying each bit position) to generate the permute control vector 810 will now be described with respect to FIGS. 10 and 11A-F. In the illustrated embodiment, the vector compression 900 comprises 6 stages 1000-1005 of shift operations for shifting the index values of the bits within the bit mask 910 to arrive at a result mask 1010 in which all index values for bits indicating valid data elements are stored to the right.

In one embodiment, the vector compression logic 800 implements the following algorithm (sometimes referred to as "genCompressControls") using the following variables:

1. For each bit of the bit mask 820 with index n find the number of zero bits of the mask preceding the bit n, denoted as Z[n].

2. Initialize the controls such that control [n]=n. That is, the control values for each of the 6-bit control elements in the permute control vector 810 are initialized to the sequential index values in the bit mask (e.g., control[0]=0, control [1]=1, control[2]=2, etc).

3. Logically, every such control value corresponding to a valid byte (i.e., a 1 of the bit mask) should be shifted to the right by Z[i] bits where Z[i] is the number of zero values to the right of the value at the index "i." In one embodiment, the following operations are performed at each stage 1000-1005 to accomplish this goal:

Stage 1000:

For each index n<63 if Z[n+1][0]=1 then control[n] is replaced by control[n+1]. In this example, the [0] in the expression Z[n+1][0] refers to the bit in bit position 0 of the value for Z[n+1], which is a 6-bit value having bit positions 0-5. In one embodiment, Z[n+1] is determined by counting the number of zero values to the right of the bit at bit position n+1 in the bit mask 820. If the 6-bit value of Z[n+1] has a 1 in bit position 0, then control[n] is set equal to control [n+1]. If the 6-bit value of Z[n+1] has a 0 in bit position 0, then control[n] remains unchanged This operation is illustrated in logic block 1100 in FIG. 11A, in which a 2:1 mux 1110 outputs either [n+1] or [n] in response to the value of Z[n+1][0]. In one embodiment, stage 1000 shown in FIG. 10 uses 63 similar muxes to concurrently perform the shift operations resulting from the concurrently calculated values for Z[n+1][0].

Stage 1001:

For each index n<62 if Z[n+2][1]=1 then control[n] is replaced by control[n+2]. In this example, the [1] in the expression Z[n+2][1] refers to the bit in bit position 1 of the value for Z[n+2] (which, as mentioned is a 6-bit value having bit positions 0-5). In one embodiment, Z[n+2] is determined by counting the number of zero values to the right of the bit at bit position n+2 in the bit mask 820. If the 6-bit value of Z[n+2] has a 1 in bit position 1, then control[n] is set equal to control [n+2]. If the 6-bit value of Z[n+2] has a 0 in bit position 1, then control[n] remains. unchanged.

Figure 10:
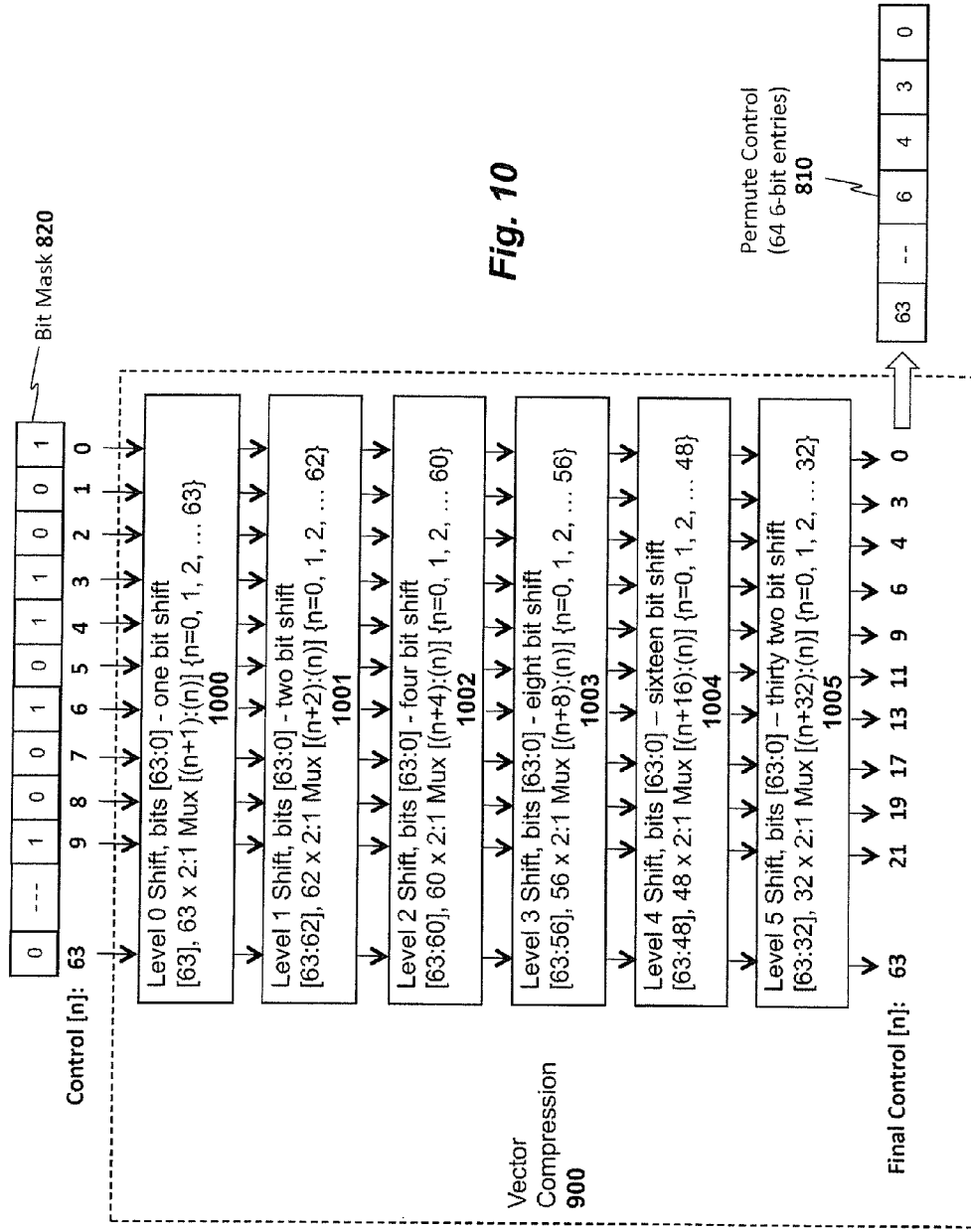
FIG. 10 illustrates additional details associated with the vector compression logic including a plurality of levels for performing shift operations.
Figure 11B:
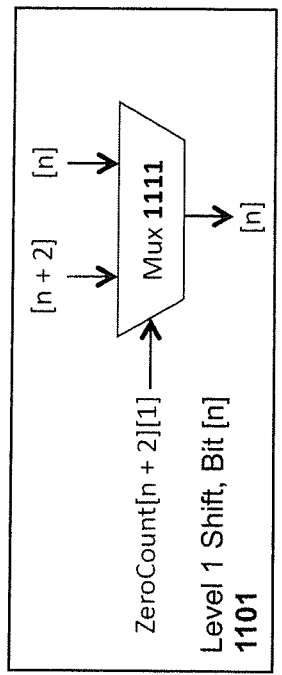
FIG. 11A-F illustrate details associated with each of the shift levels in accordance with one embodiment.
Figure 11A:
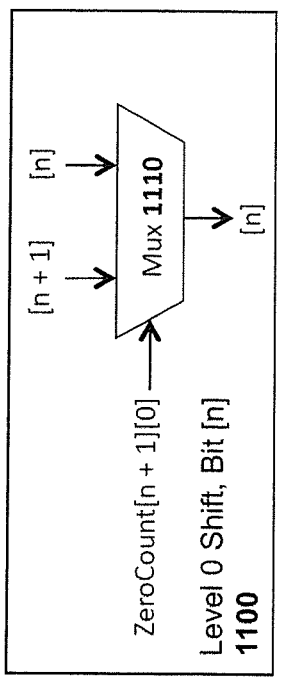

This operation is illustrated in logic block 1101 in FIG. 11B, in which a 2:1 mux 1111 outputs either [n+2] or [n] in response to the value of Z[n+2][1]. In one embodiment, stage 1001 shown in FIG. 10 uses 62 similar muxes to concurrently perform the shift operations resulting from the concurrently calculated values for Z[n+2][1].

Stage 1002:

For each index n<60 if Z[n+4][2]=1 then control[n] is replaced by control[n+4]. In this example, the [2] in the expression Z[n+4][2] refers to the bit in bit position 2 of the value for Z[n+4]. In one embodiment, Z[n+4] is determined by counting the number of zero values to the right of the bit at bit position n+4 in the bit mask 820. If the 6-bit value of Z[n+4] has a 1 in bit position 2, then control[n] is set equal to control [n+4]. If the 6-bit value of Z[n+4] has a 0 in bit position 2, then control[n] remains unchanged.

Figure 11D:
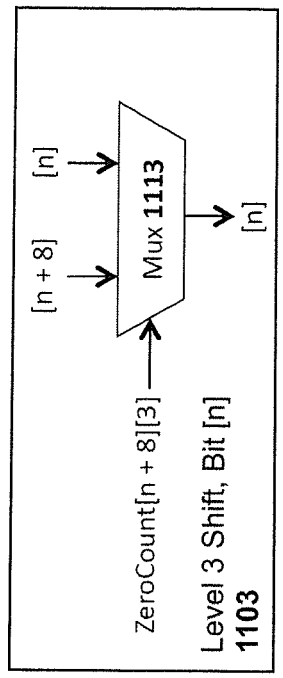
Figure 11C:
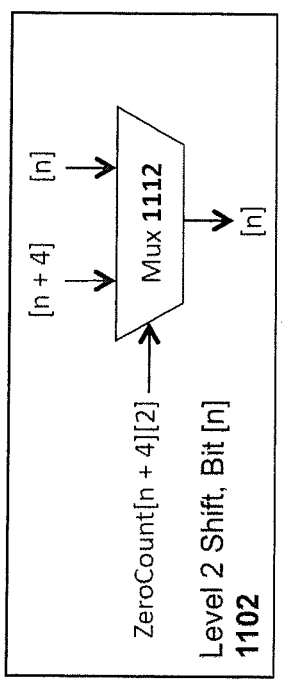

This operation is illustrated in logic block 1102 in FIG. 11C, in which a 2:1 mux 1112 outputs either [n+2] or [n] in response to the value of Z[n+4][2]. In one embodiment, stage 1002 shown in FIG. 10 uses 60 similar muxes to concurrently perform the shift operations resulting from the concurrently calculated values for Z[n+4][2].

Stage 1003:

For each index n<56 if Z[n+8][3]=1 then control[n] is replaced by control[n+8]. In this example, the [3] in the expression Z[n+8][3] refers to the bit in bit position 3 of the value for Z[n+8]. In one embodiment, Z[n+8] is determined by counting the number of zero values to the right of the bit at bit position n+8 in the bit mask 820. If the 6-bit value of Z[n+8] has a 1 in bit position 3, then control[n] is set equal to control [n+8]. If the 6-bit value of Z[n+8] has a 0 in bit position 3, then control[n] remains unchanged.

This operation is illustrated in logic block 1103 in FIG. 11D, in which a 2:1 mux 1113 outputs either [n+8] or [n] in response to the value of Z[n+8][3]. In one embodiment, stage 1003 shown in FIG. 10 uses 56 similar muxes to concurrently perform the shift operations resulting from the concurrently calculated values for Z[n+8][3].

Stage 1004:

For each index n<48 if Z[n+16][4]=1 then control[n] is replaced by control[n+16]. In this example, the [4] in the expression Z[n+16][4] refers to the bit in bit position 4 of the value for Z[n+16]. In one embodiment, Z[n+16] is determined by counting the number of zero values to the right of the bit at bit position n+16 in the bit mask 820. If the 6-bit value of Z[n+16] has a 1 in bit position 4, then control[n] is set equal to control [n+16]. If the 6-bit value of Z[n+16] has a 0 in bit position 4, then control[n] remains unchanged.

Figure 11F:
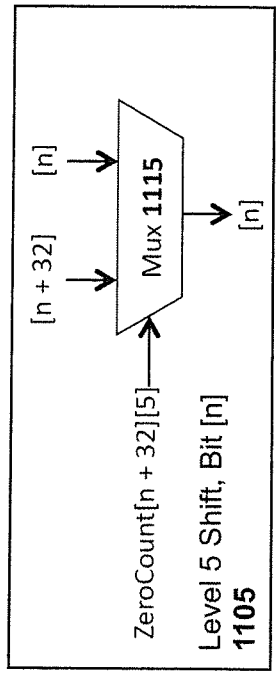
Figure 11E:
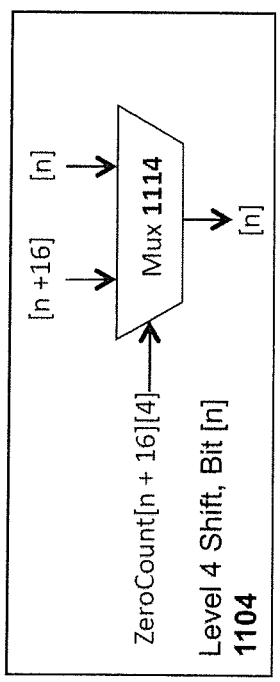

This operation is illustrated in logic block 1104 in FIG. 11E, in which a 2:1 mux 1114 outputs either [n+16] or [n] in response to the value of Z[n+16][4]. In one embodiment, stage 1004 shown in FIG. 10 uses 48 similar muxes to concurrently perform the shift operations resulting from the concurrently calculated values for Z[n+16][4].

Stage 1005:

For each index n<32 if Z[n+32][5]=1 then control[n] is replaced by control[n+32]. In this example, the [5] in the expression Z[n+16][5] refers to the bit in bit position 5 of the value for Z[n+32]. In one embodiment, Z[n+32] is determined by counting the number of zero values to the right of the bit at bit position n+32 in the bit mask 820. If the 6-bit value of Z[n+32] has a 1 in bit position 5, then control[n] is set equal to control [n+32]. If the 6-bit value of Z[n+32] has a 0 in bit position 5, then control[n] unchanged.

This operation is illustrated in logic block 1105 in FIG. 11F, in which a 2:1 mux 1115 outputs either [n+32] or [n] in response to the value of Z[n+32][5]. In one embodiment, stage 1005 shown in FIG. 10 uses 32 similar muxes to concurrently perform the shift operations resulting from the concurrently calculated values for Z[n+32][5].

As illustrated in FIG. 10, in one embodiment, in the final control vector output from stage 1005, all control values corresponding to a 1 in the bit mask 820 are positioned in order to the right. The resulting control values are then used as the permute control 810 to the shuffle logic 801 to generate the destination vector 815 in which valid bytes in the source vector 805 are stored contiguously towards the right.

The vector compression logic 800 described above is extremely efficient in terms of both area and time. The described operations may be performed using $n*\log^2(n)$ silicon area and log n time, where n is the number of mask bits (64 in the illustrated example), which represents a significant improvement over existing compression techniques.

Figure 12:
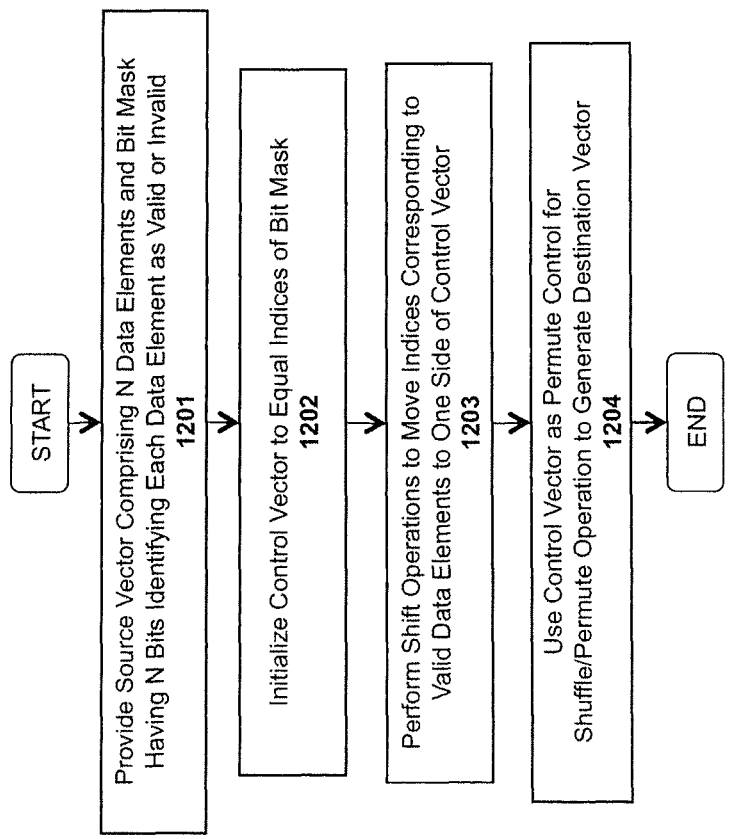
FIG. 12 illustrates a method in accordance with one embodiment of the invention.

FIG. 12 illustrates a method in accordance with one embodiment of the invention. The method may be implemented within the context of the architectures described above but is not limited to any specific architectures. At 1201, a source vector is provided comprising N data elements (e.g., 64 in the above examples) and a bit mask having N bits, where each bit indicates whether a corresponding data element in the source vector is valid or invalid. At 1202, a control vector having N elements (e.g., 64 6-bit control elements in the above examples) is set equal to the indices of the valid data bytes. At 1203, a plurality of shift operations are performed to move those indices identifying valid data elements (i.e., a bit value of 1 in the bit mask) to one side of the control vector (e.g., to the right).

In one embodiment, for a source vector and a bit mask comprising N data elements and N bits, respectively, M levels of shift operations are implemented where $2^M=N$. For example, in the embodiments described above, $2^6=64$ and there are 6 levels of shift operations (levels 0-5). In one embodiment, the shift levels are arranged in order from Level 0 to Level M−1 and each shift level shifts specified control indices to the right by an amount of $2^L$ where L is the current level (0≤L<M−1). Of course, in an alternate embodiment, the shift may be performed to the left rather than to the right while still complying with the underlying principles of the invention. As described above, the indices of the control vector to be shifted are identified based on a determined Zero Count (Z) value comprising the number of invalid data elements to the right (or left in an alternate embodiment) of the value of $n+2^L$ where n represents each index of the current control vector. In one embodiment, the value of $Z[n+2^L][L]$ is used to determine whether to shift, where [L] identifies a bit position within the zero count for the value $Z[n+2^L]$. In particular, in one embodiment, if $Z[n+2^L][L]=1$ then control[n] is replaced by control[$n+2^L$].

Once the shift of the final operations have been completed, at 1204, the resulting control vector is used as permute control for a shuffle/permute operation to generate the destination vector. As mentioned, at this stage the indices in the control vector are arranged such that all indices identifying valid data elements are arranged contiguously to the right. As such, the resulting destination vector has all valid data elements positioned to the right in the destination register.

The above vector compression techniques have been mathematically checked with a trusted theorem prover. For the sake of completeness, the following proofs are provided:

The function ZeroCount is assumed to behave as follows: If mask is a 64-bit vector and Z=ZeroCount(mask), then Z is an array of 65 6-bit vectors such that for 0≤n<64, Z[n] is the number of indices i, 0≤i<n, for which mask[i]=0.

Thus, the total number of indices i, 0≤i<64, for which mask[i]=1 is 64−Z[64]. The objective of GenCompressControls, as specified by the final result below, is to compute an array containing those indices, listed in increasing order.

Lemma 1

Let Z=ZeroCount(mask). Let 0≤m≤n<64, 0≤k<6, and $n-Z[n][k-1:0]\le m.$

Then Z[n][k]=Z[m][k].

Proof:

Since m≤n, Z[m]≤Z[n], which implies Z[m][5:k]≤Z[n][5:k]. Suppose Z[m][k]≠Z[n][k]. Then Z[n][5:k]−Z[m][5:k]≥1 and $Z[n] - Z[m] = Z[n][5:0] - Z[m][5:0]$ $= 2^k Z[n][5:k] + Z[n][k-1:0] - 2^k Z[m][5:k] + Z[m][k-1:0]$ $= 2^k (Z[n][5:k] - Z[m][5:k]) + Z[n][k-1:0] - Z[m][k-1:0]$ $\ge 2^k + Z[n][k-1:0] - (2^k - 1)$ $= Z[n][k-1:0] + 1.$ On the other hand, $Z[n]-Z[m]\le n-m\le Z[n][k-1:0],$ a contradiction. 2

Lemma 2

Let Z=ZeroCount(mask). Let 0≤n≤m<64, 0≤k<6, and $m\le n-Z[n][k-1:0]+2^k$

Assume that mask[n]=1. Then Z[n][k]=Z[m][k].

Proof:

Since n≤m, Z[n]≤Z[m], which implies Z[n][5:k]≤Z[m][5:k]. Suppose Z[m][k]≠Z[n][k]. Then Z[m][5:k]−Z[n][5:k]≥1 and $Z[m] - Z[n] = 2^k Z[m][5:k] + Z[m][k-1:0] - 2^k Z[n][5:k] + Z[n][k-1:0]$ $= 2^k (Z[m][5:k] - Z[n][5:k]) + Z[m][k-1:0] - Z[n][k-1:0]$ $\ge 2^k - Z[n][k-1:0].$ On the other hand, $Z[m]-Z[n]=Z[m]-Z[n+1]\le m-n-1\le 2^k-Z[n][k-1:0]-1,$ a contradiction. 2

Lemma 3

Let Z=ZeroCount(mask) and C≤GenCompressControls (mask), where mask=

0. For all n, 0≤n<64, if mask[n]=1, then $C[n-Z[n]][5:0]=n.$

Proof:

For 0≤k≤6, let $C_k$ be the value of ctrl after k iterations of the main loop in the evaluation of GenCompressControls (mask). It is clear that for 0≤i<64, $C_0[i]=i$ (0.1)

and for 0≤k<6, $C_k+1[i] = C_k[i+2^k]$ if $i+2^k < 64$ and $Z[i+2^k][k] = 1$ (0.2)

$= C_k[i]$ otherwise.

We shall prove by induction on k that for $0 \leq k \leq 6$ and $0 \leq n < 64$, $$C_k[n-Z[n][k-1:0]]=n.$$

From this it follows that $$C[n-Z[n]][5:0]=C_6[n-Z[n]]=C_6[n-Z[n][5:0]]=n.$$

The case k=0 is a consequence of (0.1):

$$C_0[n-Z[n][-1:0]]=C_0[n]=n.$$

Let $0 \leq k < 6$ and assume that $C_k[n-Z[n][k-1:0]]=n$ for all n, $0 \leq n \leq 64$. Let n be fixed and let $i=n-Z[n][k:0]$. We must show that $C_{k+1}[i]=n$. First suppose that $Z[n][k]=1$. Then $Z[n][k:0]=2^k+Z[n][k-1:0]$ and $$i+2^k=n(2^k+Z[n][k-1:0])+2^k=n-Z[n][k-1:0]<64.$$

Applying Lemma 1 with $m=n-Z[n][k-1:0]$, we have $$Z[n-Z[n][k-1:0]][k]=Z[n][k]=1,$$

and hence, by (0.2), $$C_{k+1}[i]=C_k[i+2^k]=C_k(n-Z[n][k-1:0]]=n.$$

Now suppose that $Z[n][k]=0$. Then $$i=n-Z[n][k:0]=n-Z[n][k-1:0].$$

We may assume that $i+2^k<64$, for otherwise, by (0.2), $$C_{k+1}[i]=C_k[i]=C_k[n-Z[n][k-1:0]]=n.$$

Thus;

$$n=i+Z[n][k-1:0]<+2^k=n-Z[n][k-1:0]+2^k$$

and we may apply Lemma 2 with $m=i+2^k$, which yields $$Z[i+2^k][k]=Z[n][k]=0.$$

Thus, by (0.2), $$C_{k+1}[i]=C_k[i]=C_k[n-Z[n][k-1:0]]=n. \quad 2$$

Theorem 1
Let Z=ZeroCount(mask) and W=64-Z[64], and C=GenCompressControls(mask).
(a) If $0 \leq i < 64$, then $C[i][7]=1 \Leftrightarrow i<W$.
(b) If $0 \leq i < W$, then mask$[C[i][5:0]]=1$
(c) If $0 \leq i < j < W$, then $C[i][5:0]$ $C[j][5:0]$.
Proof:
(a) is an obvious consequence of the definition of GenCompressControls. For the proof of (b) and (c), let $$\text{mask}[b_0]=\text{mask}[b_1]= \ldots \text{mask}[b_{w-1}]=1.$$

where $0 \leq b_0 < b_1 < \ldots > b_{w-1} < 64$. We shall show that for all i, $0 \leq i \leq W$, $$b_i-Z[b_i]=i$$

Clearly, for $0 \leq n < 64$, mask$[n]=1 \Leftrightarrow n=b_i$ for some i. In particular, mask$[n]=0$ for
$0 \leq n < b_0$. It follows that $Z[b_0]=b_0$ and the claim holds for i=0. Similarly, for $i>0$, $$Z[b_i]=Z[b_{i-1}]+b_i-b_{i-1}-1$$

and by induction, $$b_i-Z[b_i]=b_{i-1}-Z[b_{i-1}]+1-(i-1)+1=i$$

Now by Lemma 3, $$C[i][5:0]=C[b_i-Z[b_i]][5:0]=b_i$$

and both (b) and (c) follow. 2

Exemplary Instruction Formats

Embodiments of the instruction(s) described herein may be embodied in different formats. Additionally, exemplary systems, architectures, and pipelines are detailed below. Embodiments of the instruction(s) may be executed on such systems, architectures, and pipelines, but are not limited to those detailed.

A vector friendly instruction format is an instruction format that is suited for vector instructions (e.g., there are certain fields specific to vector operations). While embodiments are described in which both vector and scalar operations are supported through the vector friendly instruction format, alternative embodiments use only vector operations the vector friendly instruction format.

Figure 13A:
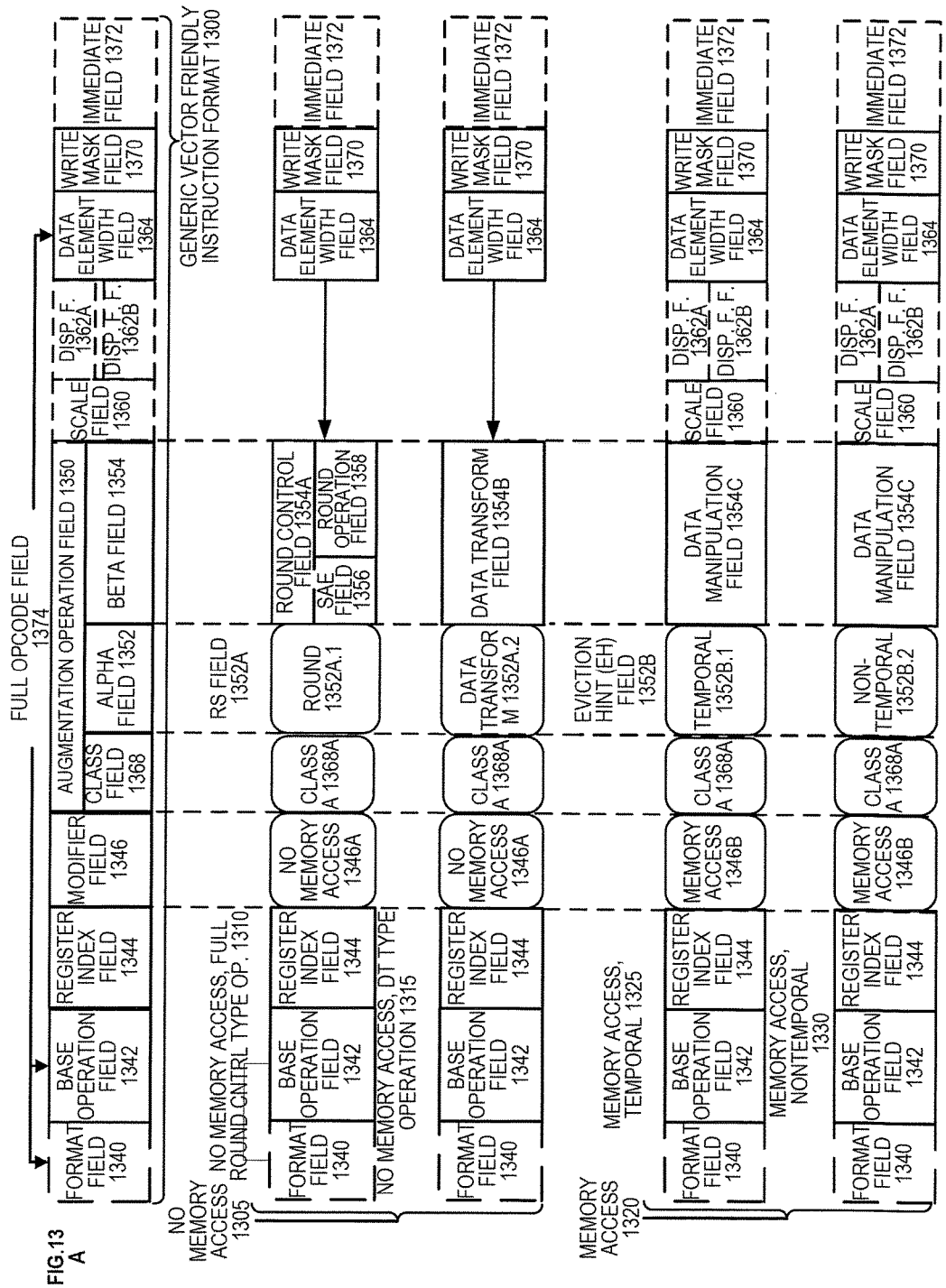

FIGS. 13A-13B are block diagrams illustrating a generic vector friendly instruction format and instruction templates thereof according to embodiments of the invention. FIG. 13A is a block diagram illustrating a generic vector friendly instruction format and class A instruction templates thereof according to embodiments of the invention; while FIG. 13B is a block diagram illustrating the generic vector friendly instruction format and class B instruction templates thereof according to embodiments of the invention. Specifically, a generic vector friendly instruction format 1300 for which are defined class A and class B instruction templates, both of which include no memory access 1305 instruction templates and memory access 1320 instruction templates. The term generic in the context of the vector friendly instruction format refers to the instruction format not being tied to any specific instruction set.

While embodiments of the invention will be described in which the vector friendly instruction format supports the following: a 64 byte vector operand length (or size) with 32 bit (4 byte) or 64 bit (8 byte) data element widths (or sizes) (and thus, a 64 byte vector consists of either 16 doubleword-size elements or alternatively, 8 quadword-size elements); a 64 byte vector operand length (or size) with 16 bit (2 byte) or 8 bit (1 byte) data element widths (or sizes); a 32 byte vector operand length (or size) with 32 bit (4 byte), 64 bit (8 byte), 16 bit (2 byte), or 8 bit (1 byte) data element widths (or sizes); and a 16 byte vector operand length (or size) with 32 bit (4 byte), 64 bit (8 byte), 16 bit (2 byte), or 8 bit (1 byte) data element widths (or sizes); alternative embodiments may support more, less and/or different vector operand sizes (e.g., 256 byte vector operands) with more, less, or different data element widths (e.g., 128 bit (16 byte) data element widths).

The class A instruction templates in FIG. 13A include: 1) within the no memory access 1305 instruction templates there is shown a no memory access, full round control type operation 1310 instruction template and a no memory access, data transform type operation 1315 instruction template; and 2) within the memory access 1320 instruction templates there is shown a memory access, temporal 1325 instruction template and a memory access, non-temporal 1330 instruction template. The class B instruction templates in FIG. 13B include: 1) within the no memory access 1305 instruction templates there is shown a no memory access, write mask control, partial round control type operation 1312 instruction template and a no memory access, write mask control, vsize type operation 1317 instruction template; and 2) within the memory access 1320 instruction templates there is shown a memory access, write mask control 1327 instruction template.

The generic vector friendly instruction format 1300 includes the following fields listed below in the order illustrated in FIGS. 13A-13B.

Format field 1340—a specific value (an instruction format identifier value) in this field uniquely identifies the vector friendly instruction format, and thus occurrences of instructions in the vector friendly instruction format in instruction streams. As such, this field is optional in the sense that it is not needed for an instruction set that has only the generic vector friendly instruction format.

Base operation field 1342—its content distinguishes different base operations.

Register index field 1344—its content, directly or through address generation, specifies the locations of the source and destination operands, be they in registers or in memory. These include a sufficient number of bits to select N registers from a P×Q (e.g. 32×512, 16×128, 32×1024, 64×1024) register file. While in one embodiment N may be up to three sources and one destination register, alternative embodiments may support more or less sources and destination registers (e.g., may support up to two sources where one of these sources also acts as the destination, may support up to three sources where one of these sources also acts as the destination, may support up to two sources and one destination).

Modifier field 1346—its content distinguishes occurrences of instructions in the generic vector instruction format that specify memory access from those that do not; that is, between no memory access 1305 instruction templates and memory access 1320 instruction templates. Memory access operations read and/or write to the memory hierarchy (in some cases specifying the source and/or destination addresses using values in registers), while non-memory access operations do not (e.g., the source and destinations are registers). While in one embodiment this field also selects between three different ways to perform memory address calculations, alternative embodiments may support more, less, or different ways to perform memory address calculations.

Augmentation operation field 1350—its content distinguishes which one of a variety of different operations to be performed in addition to the base operation. This field is context specific. In one embodiment of the invention, this field is divided into a class field 1368, an alpha field 1352, and a beta field 1354. The augmentation operation field 1350 allows common groups of operations to be performed in a single instruction rather than 2, 3, or 4 instructions.

Scale field 1360—its content allows for the scaling of the index field's content for memory address generation (e.g., for address generation that uses $2^{scale}*\text{index}+\text{base}$).

Displacement Field 1362A—its content is used as part of memory address generation (e.g., for address generation that uses $2^{scale}*\text{index}+\text{base}+\text{displacement}$).

Displacement Factor Field 1362B (note that the juxtaposition of displacement field 1362A directly over displacement factor field 1362B indicates one or the other is used)—its content is used as part of address generation; it specifies a displacement factor that is to be scaled by the size of a memory access (N)—where N is the number of bytes in the memory access (e.g., for address generation that uses $2^{scale}*\text{index}+\text{base}+\text{scaled displacement}$). Redundant low-order bits are ignored and hence, the displacement factor field's content is multiplied by the memory operands total size (N) in order to generate the final displacement to be used in calculating an effective address. The value of N is determined by the processor hardware at runtime based on the full opcode field 1374 (described herein) and the data manipulation field 1354C. The displacement field 1362A and the displacement factor field 1362B are optional in the sense that they are not used for the no memory access 1305 instruction templates and/or different embodiments may implement only one or none of the two.

Data element width field 1364—its content distinguishes which one of a number of data element widths is to be used (in some embodiments for all instructions; in other embodiments for only some of the instructions). This field is optional in the sense that it is not needed if only one data element width is supported and/or data element widths are supported using some aspect of the opcodes.

Write mask field 1370—its content controls, on a per data element position basis, whether that data element position in the destination vector operand reflects the result of the base operation and augmentation operation. Class A instruction templates support merging-writemasking, while class B instruction templates support both merging- and zeroing-writemasking. When merging, vector masks allow any set of elements in the destination to be protected from updates during the execution of any operation (specified by the base operation and the augmentation operation); in other one embodiment, preserving the old value of each element of the destination where the corresponding mask bit has a 0. In contrast, when zeroing vector masks allow any set of elements in the destination to be zeroed during the execution of any operation (specified by the base operation and the augmentation operation); in one embodiment, an element of the destination is set to 0 when the corresponding mask bit has a 0 value. A subset of this functionality is the ability to control the vector length of the operation being performed (that is, the span of elements being modified, from the first to the last one); however, it is not necessary that the elements that are modified be consecutive. Thus, the write mask field 1370 allows for partial vector operations, including loads, stores, arithmetic, logical, etc. While embodiments of the invention are described in which the write mask field's 1370 content selects one of a number of write mask registers that contains the write mask to be used (and thus the write mask field's 1370 content indirectly identifies that masking to be performed), alternative embodiments instead or additional allow the mask write field's 1370 content to directly specify the masking to be performed.

Immediate field 1372—its content allows for the specification of an immediate. This field is optional in the sense that is it not present in an implementation of the generic vector friendly format that does not support immediate and it is not present in instructions that do not use an immediate.

Class field 1368—its content distinguishes between different classes of instructions. With reference to FIGS. 13A-B, the contents of this field select between class A and class B instructions. In FIGS. 13A-B, rounded corner squares are used to indicate a specific value is present in a field (e.g., class A 1368A and class B 1368B for the class field 1368 respectively in FIGS. 13A-B).

Instruction Templates of Class A

In the case of the non-memory access 1305 instruction templates of class A, the alpha field 1352 is interpreted as an RS field 1352A, whose content distinguishes which one of the different augmentation operation types are to be performed (e.g., round 1352A.1 and data transform 1352A.2 are respectively specified for the no memory access, round type operation 1310 and the no memory access, data transform type operation 1315 instruction templates), while the beta field 1354 distinguishes which of the operations of the specified type is to be performed. In the no memory access 1305 instruction templates, the scale field 1360, the displacement field 1362A, and the displacement scale filed 1362B are not present.

No-Memory Access Instruction Templates—Full Round Control Type Operation

In the no memory access full round control type operation 1310 instruction template, the beta field 1354 is interpreted as a round control field 1354A, whose content(s) provide static rounding. While in the described embodiments of the invention the round control field 1354A includes a suppress all floating point exceptions (SAE) field 1356 and a round operation control field 1358, alternative embodiments may support may encode both these concepts into the same field or only have one or the other of these concepts/fields (e.g., may have only the round operation control field 1358).

SAE field 1356—its content distinguishes whether or not to disable the exception event reporting; when the SAE field's 1356 content indicates suppression is enabled, a given instruction does not report any kind of floating-point exception flag and does not raise any floating point exception handler.

Round operation control field 1358—its content distinguishes which one of a group of rounding operations to perform (e.g., Round-up, Round-down, Round-towards-zero and Round-to-nearest). Thus, the round operation control field 1358 allows for the changing of the rounding mode on a per instruction basis. In one embodiment of the invention where a processor includes a control register for specifying rounding modes, the round operation control field's 1350 content overrides that register value.

No Memory Access Instruction Templates—Data Transform Type Operation

In the no memory access data transform type operation 1315 instruction template, the beta field 1354 is interpreted as a data transform field 1354B, whose content distinguishes which one of a number of data transforms is to be performed (e.g., no data transform, swizzle, broadcast).

In the case of a memory access 1320 instruction template of class A, the alpha field 1352 is interpreted as an eviction hint field 1352B, whose content distinguishes which one of the eviction hints is to be used (in FIG. 13A, temporal 1352B.1 and non-temporal 1352B.2 are respectively specified for the memory access, temporal 1325 instruction template and the memory access, non-temporal 1330 instruction template), while the beta field 1354 is interpreted as a data manipulation field 1354C, whose content distinguishes which one of a number of data manipulation operations (also known as primitives) is to be performed (e.g., no manipulation; broadcast; up conversion of a source; and down conversion of a destination). The memory access 1320 instruction templates include the scale field 1360, and optionally the displacement field 1362A or the displacement scale field 1362B.

Vector memory instructions perform vector loads from and vector stores to memory, with conversion support. As with regular vector instructions, vector memory instructions transfer data from/to memory in a data element-wise fashion, with the elements that are actually transferred is dictated by the contents of the vector mask that is selected as the write mask.

Memory Access Instruction Templates—Temporal

Temporal data is data likely to be reused soon enough to benefit from caching. This is, however, a hint, and different processors may implement it in different ways, including ignoring the hint entirely.

Memory Access Instruction Templates—Non-Temporal

Non-temporal data is data unlikely to be reused soon enough to benefit from caching in the 1st-level cache and should be given priority for eviction. This is, however, a hint, and different processors may implement it in different ways, including ignoring the hint entirely.

Instruction Templates of Class B

In the case of the instruction templates of class B, the alpha field 1352 is interpreted as a write mask control (Z) field 1352C, whose content distinguishes whether the write masking controlled by the write mask field 1370 should be a merging or a zeroing.

In the case of the non-memory access 1305 instruction templates of class B, part of the beta field 1354 is interpreted as an RL field 1357A, whose content distinguishes which one of the different augmentation operation types are to be performed (e.g., round 1357A.1 and vector length (VSIZE) 1357A.2 are respectively specified for the no memory access, write mask control, partial round control type operation 1312 instruction template and the no memory access, write mask control, VSIZE type operation 1317 instruction template), while the rest of the beta field 1354 distinguishes which of the operations of the specified type is to be performed. In the no memory access 1305 instruction templates, the scale field 1360, the displacement field 1362A, and the displacement scale filed 1362B are not present.

In the no memory access, write mask control, partial round control type operation 1310 instruction template, the rest of the beta field 1354 is interpreted as a round operation field 1359A and exception event reporting is disabled (a given instruction does not report any kind of floating-point exception flag and does not raise any floating point exception handler).

Round operation control field 1359A—just as round operation control field 1358, its content distinguishes which one of a group of rounding operations to perform (e.g., Round-up, Round-down, Round-towards-zero and Round-to-nearest). Thus, the round operation control field 1359A allows for the changing of the rounding mode on a per instruction basis. In one embodiment of the invention where a processor includes a control register for specifying rounding modes, the round operation control field's 1350 content overrides that register value.

In the no memory access, write mask control, VSIZE type operation 1317 instruction template, the rest of the beta field 1354 is interpreted as a vector length field 1359B, whose content distinguishes which one of a number of data vector lengths is to be performed on (e.g., 128, 256, or 512 byte).

In the case of a memory access 1320 instruction template of class B, part of the beta field 1354 is interpreted as a broadcast field 1357B, whose content distinguishes whether or not the broadcast type data manipulation operation is to be performed, while the rest of the beta field 1354 is interpreted the vector length field 1359B. The memory access 1320 instruction templates include the scale field 1360, and optionally the displacement field 1362A or the displacement scale field 1362B.

With regard to the generic vector friendly instruction format 1300, a full opcode field 1374 is shown including the format field 1340, the base operation field 1342, and the data element width field 1364. While one embodiment is shown where the full opcode field 1374 includes all of these fields, the full opcode field 1374 includes less than all of these fields in embodiments that do not support all of them. The full opcode field 1374 provides the operation code (opcode).

The augmentation operation field 1350, the data element width field 1364, and the write mask field 1370 allow these features to be specified on a per instruction basis in the generic vector friendly instruction format.

The combination of write mask field and data element width field create typed instructions in that they allow the mask to be applied based on different data element widths.

The various instruction templates found within class A and class B are beneficial in different situations. In some embodiments of the invention, different processors or different cores within a processor may support only class A, only class B, or both classes. For instance, a high performance general purpose out-of-order core intended for general-purpose computing may support only class B, a core intended primarily for graphics and/or scientific (throughput) computing may support only class A, and a core intended for both may support both (of course, a core that has some mix of templates and instructions from both classes but not all templates and instructions from both classes is within the purview of the invention). Also, a single processor may include multiple cores, all of which support the same class or in which different cores support different class. For instance, in a processor with separate graphics and general purpose cores, one of the graphics cores intended primarily for graphics and/or scientific computing may support only class A, while one or more of the general purpose cores may be high performance general purpose cores with out of order execution and register renaming intended for general-purpose computing that support only class B. Another processor that does not have a separate graphics core, may include one more general purpose in-order or out-of-order cores that support both class A and class B. Of course, features from one class may also be implement in the other class in different embodiments of the invention. Programs written in a high level language would be put (e.g., just in time compiled or statically compiled) into an variety of different executable forms, including: 1) a form having only instructions of the class(es) supported by the target processor for execution; or 2) a form having alternative routines written using different combinations of the instructions of all classes and having control flow code that selects the routines to execute based on the instructions supported by the processor which is currently executing the code.

FIG. 14A-D are block diagrams illustrating an exemplary specific vector friendly instruction format according to embodiments of the invention. FIG. 14 shows a specific vector friendly instruction format 1400 that is specific in the sense that it specifies the location, size, interpretation, and order of the fields, as well as values for some of those fields. The specific vector friendly instruction format 1400 may be used to extend the x86 instruction set, and thus some of the fields are similar or the same as those used in the existing x86 instruction set and extension thereof (e.g., AVX). This format remains consistent with the prefix encoding field, real opcode byte field, MOD R/M field, SIB field, displacement field, and immediate fields of the existing x86 instruction set with extensions. The fields from FIG. 13 into which the fields from FIG. 14 map are illustrated.

It should be understood that, although embodiments of the invention are described with reference to the specific vector friendly instruction format 1400 in the context of the generic vector friendly instruction format 1300 for illustrative purposes, the invention is not limited to the specific vector friendly instruction format 1400 except where claimed. For example, the generic vector friendly instruction format 1300 contemplates a variety of possible sizes for the various fields, while the specific vector friendly instruction format 1400 is shown as having fields of specific sizes. By way of specific example, while the data element width field 1364 is illustrated as a one bit field in the specific vector friendly instruction format 1400, the invention is not so limited (that is, the generic vector friendly instruction format 1300 contemplates other sizes of the data element width field 1364).

The generic vector friendly instruction format 1300 includes the following fields listed below in the order illustrated in FIG. 14A.

EVEX Prefix (Bytes 0-3) 1402—is encoded in a four-byte form.

Format Field 1340 (EVEX Byte 0, bits [7:0])—the first byte (EVEX Byte 0) is the format field 1340 and it contains 0x62 (the unique value used for distinguishing the vector friendly instruction format in one embodiment of the invention).

The second-fourth bytes (EVEX Bytes 1-3) include a number of bit fields providing specific capability.

REX field 1405 (EVEX Byte 1, bits [7-5])—consists of a EVEX.R bit field (EVEX Byte 1, bit [7]—R), EVEX.X bit field (EVEX byte 1, bit [6]—X), and 1357BEX byte 1, bit[5]—B). The EVEX.R, EVEX.X, and EVEX.B bit fields provide the same functionality as the corresponding VEX bit fields, and are encoded using 1s complement form, i.e. ZMM0 is encoded as 1311B, ZMM15 is encoded as 0000B. Other fields of the instructions encode the lower three bits of the register indexes as is known in the art (rrr, xxx, and bbb), so that Rrrr, Xxxx, and Bbbb may be formed by adding EVEX.R, EVEX.X, and EVEX.B.

REX' field 1310—this is the first part of the REX' field 1310 and is the EVEX.R' bit field (EVEX Byte 1, bit [4]—R') that is used to encode either the upper 16 or lower 16 of the extended 32 register set. In one embodiment of the invention, this bit, along with others as indicated below, is stored in bit inverted format to distinguish (in the well-known x86 32-bit mode) from the BOUND instruction, whose real opcode byte is 62, but does not accept in the MOD R/M field (described below) the value of 11 in the MOD field; alternative embodiments of the invention do not store this and the other indicated bits below in the inverted format. A value of 1 is used to encode the lower 16 registers. In other words, R'Rrrr is formed by combining EVEX.R', EVEX.R, and the other RRR from other fields.

Opcode map field 1415 (EVEX byte 1, bits [3:0]—mmmm)—its content encodes an implied leading opcode byte (0F, 0F 38, or 0F 3).

Data element width field 1364 (EVEX byte 2, bit [7]—W)—is represented by the notation EVEX.W. EVEX.W is used to define the granularity (size) of the datatype (either 32-bit data elements or 64-bit data elements).

EVEX.vvvv 1420 (EVEX Byte 2, bits [6:3]—vvvv)—the role of EVEX.vvvv may include the following: 1) EVEX.vvvv encodes the first source register operand, specified in inverted (1 s complement) form and is valid for instructions with 2 or more source operands; 2) EVEX.vvvv encodes the destination register operand, specified in 1 s complement form for certain vector shifts; or 3) EVEX.vvvv does not encode any operand, the field is reserved and should contain 1311b. Thus, EVEX.vvvv field 1420 encodes the 4 low-order bits of the first source register specifier stored in inverted (1 s complement) form. Depending on the instruction, an extra different EVEX bit field is used to extend the specifier size to 32 registers.

EVEX.U 1368 Class field (EVEX byte 2, bit [2]—U)—If EVEX.0=0, it indicates class A or EVEX.U0; if EVEX.U=1, it indicates class B or EVEX.U1.

Prefix encoding field 1425 (EVEX byte 2, bits [1:0]—pp)—provides additional bits for the base operation field. In addition to providing support for the legacy SSE instructions in the EVEX prefix format, this also has the benefit of compacting the SIMD prefix (rather than requiring a byte to express the SIMD prefix, the EVEX prefix requires only 2 bits). In one embodiment, to support legacy SSE instructions that use a SIMD prefix (66H, F2H, F3H) in both the legacy format and in the EVEX prefix format, these legacy SIMD prefixes are encoded into the SIMD prefix encoding field; and at runtime are expanded into the legacy SIMD prefix prior to being provided to the decoder's PLA (so the PLA can execute both the legacy and EVEX format of these legacy instructions without modification). Although newer instructions could use the EVEX prefix encoding field's content directly as an opcode extension, certain embodiments expand in a similar fashion for consistency but allow for different meanings to be specified by these legacy SIMD prefixes. An alternative embodiment may redesign the PLA to support the 2 bit SIMD prefix encodings, and thus not require the expansion.

Alpha field 1352 (EVEX byte 3, bit [7]—EH; also known as EVEX.EH, EVEX.rs, EVEX.RL, EVEX.write mask control, and EVEX.N; also illustrated with α)—as previously described, this field is context specific.

Beta field 1354 (EVEX byte 3, bits [6:4]—SSS, also known as EVEX.$s_{2-0}$, EVEX.$r_{2-0}$, EVEX.rr1, EVEX.LL0, EVEX.LLB; also illustrated with βββ)—as previously described, this field is context specific.

REX' field 1310—this is the remainder of the REX' field and is the EVEX.V' bit field (EVEX Byte 3, bit [3]—V') that may be used to encode either the upper 16 or lower 16 of the extended 32 register set. This bit is stored in bit inverted format. A value of 1 is used to encode the lower 16 registers. In other words, V'VVVV is formed by combining EVEX.V', EVEX.vvvv.

Write mask field 1370 (EVEX byte 3, bits [2:0]—kkk)— its content specifies the index of a register in the write mask registers as previously described. In one embodiment of the invention, the specific value EVEX.kkk=000 has a special behavior implying no write mask is used for the particular instruction (this may be implemented in a variety of ways including the use of a write mask hardwired to all ones or hardware that bypasses the masking hardware).

Real Opcode Field 1430 (Byte 4) is also known as the opcode byte. Part of the opcode is specified in this field.

MOD R/M Field 1440 (Byte 5) includes MOD field 1442, Reg field 1444, and R/M field 1446. As previously described, the MOD field's 1442 content distinguishes between memory access and non-memory access operations. The role of Reg field 1444 can be summarized to two situations: encoding either the destination register operand or a source register operand, or be treated as an opcode extension and not used to encode any instruction operand. The role of R/M field 1446 may include the following: encoding the instruction operand that references a memory address, or encoding either the destination register operand or a source register operand.

Scale, Index, Base (SIB) Byte (Byte 6)—As previously described, the scale field's 1350 content is used for memory address generation. SIB.xxx 1454 and SIB.bbb 1456—the contents of these fields have been previously referred to with regard to the register indexes Xxxx and Bbbb.

Displacement field 1362A (Bytes 7-10)—when MOD field 1442 contains 10, bytes 7-10 are the displacement field 1362A, and it works the same as the legacy 32-bit displacement (disp32) and works at byte granularity.

Displacement factor field 1362B (Byte 7)—when MOD field 1442 contains 01, byte 7 is the displacement factor field 1362B. The location of this field is that same as that of the legacy x86 instruction set 8-bit displacement (disp8), which works at byte granularity. Since disp8 is sign extended, it can only address between −128 and 127 bytes offsets; in terms of 64 byte cache lines, disp8 uses 8 bits that can be set to only four really useful values −128, −64, 0, and 64; since a greater range is often needed, disp32 is used; however, disp32 requires 4 bytes. In contrast to disp8 and disp32, the displacement factor field 1362B is a reinterpretation of disp8; when using displacement factor field 1362B, the actual displacement is determined by the content of the displacement factor field multiplied by the size of the memory operand access (N). This type of displacement is referred to as disp8*N. This reduces the average instruction length (a single byte of used for the displacement but with a much greater range). Such compressed displacement is based on the assumption that the effective displacement is multiple of the granularity of the memory access, and hence, the redundant low-order bits of the address offset do not need to be encoded. In other words, the displacement factor field 1362B substitutes the legacy x86 instruction set 8-bit displacement. Thus, the displacement factor field 1362B is encoded the same way as an x86 instruction set 8-bit displacement (so no changes in the ModRM/SIB encoding rules) with the only exception that disp8 is overloaded to disp8*N. In other words, there are no changes in the encoding rules or encoding lengths but only in the interpretation of the displacement value by hardware (which needs to scale the displacement by the size of the memory operand to obtain a byte-wise address offset).

Immediate field 1372 operates as previously described.

Full Opcode Field

FIG. 14B is a block diagram illustrating the fields of the specific vector friendly instruction format 1400 that make up the full opcode field 1374 according to one embodiment of the invention. Specifically, the full opcode field 1374 includes the format field 1340, the base operation field 1342, and the data element width (W) field 1364. The base operation field 1342 includes the prefix encoding field 1425, the opcode map field 1415, and the real opcode field 1430.

Register Index Field

FIG. 14C is a block diagram illustrating the fields of the specific vector friendly instruction format 1400 that make up the register index field 1344 according to one embodiment of the invention. Specifically, the register index field 1344 includes the REX field 1405, the REX' field 1410, the MODR/M.reg field 1444, the MODR/M.r/m field 1446, the VVVV field 1420, xxx field 1454, and the bbb field 1456.

Augmentation Operation Field

Figure 14D:
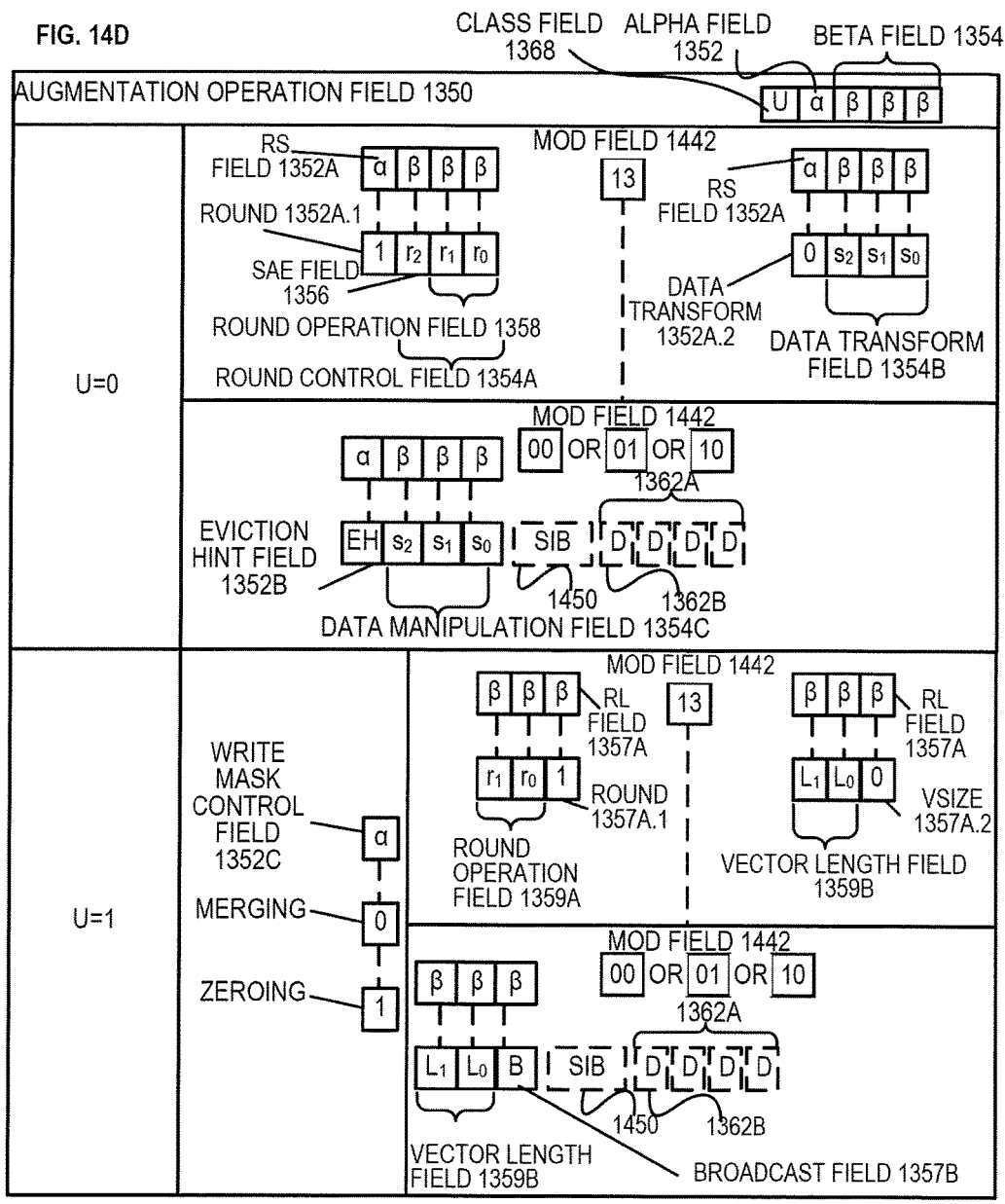

FIG. 14D is a block diagram illustrating the fields of the specific vector friendly instruction format 1400 that make up the augmentation operation field 1350 according to one embodiment of the invention. When the class (U) field 1368 contains 0, it signifies EVEX.U0 (class A 1368A); when it contains 1, it signifies EVEX.U1 (class B 1368B). When U=0 and the MOD field 1442 contains 11 (signifying a no memory access operation), the alpha field 1352 (EVEX byte 3, bit [7]—EH) is interpreted as the rs field 1352A. When the rs field 1352A contains a 1 (round 1352A.1), the beta field 1354 (EVEX byte 3, bits [6:4]—SSS) is interpreted as the round control field 1354A. The round control field 1354A includes a one bit SAE field 1356 and a two bit round operation field 1358. When the rs field 1352A contains a 0 (data transform 1352A.2), the beta field 1354 (EVEX byte 3, bits [6:4]—SSS) is interpreted as a three bit data transform field 1354B. When U=0 and the MOD field 1442 contains 00, 01, or 10 (signifying a memory access operation), the alpha field 1352 (EVEX byte 3, bit [7]—EH) is interpreted as the eviction hint (EH) field 1352B and the beta field 1354 (EVEX byte 3, bits [6:4]—SSS) is interpreted as a three bit data manipulation field 1354C.

When U=1, the alpha field 1352 (EVEX byte 3, bit [7]—EH) is interpreted as the write mask control (Z) field 1352C. When U=1 and the MOD field 1442 contains 11 (signifying a no memory access operation), part of the beta field 1354 (EVEX byte 3, bit [4]—$S_0$) is interpreted as the RL field 1357A; when it contains a 1 (round 1357A.1) the rest of the beta field 1354 (EVEX byte 3, bit [6-5]—$S_{2-1}$) is interpreted as the round operation field 1359A, while when the RL field 1357A contains a 0 (VSIZE 1357.A2) the rest of the beta field 1354 (EVEX byte 3, bit [6-5]—$S_{2-1}$) is interpreted as the vector length field 1359B (EVEX byte 3, bit [6-5]—$L_{1-0}$). When U=1 and the MOD field 1442 contains 00, 01, or 10 (signifying a memory access operation), the beta field 1354 (EVEX byte 3, bits [6:4]—SSS) is interpreted as the vector length field 1359B (EVEX byte 3, bit [6-5]—$L_{1-0}$) and the broadcast field 1357B (EVEX byte 3, bit [4]—B).

FIG. 15 is a block diagram of a register architecture 1500 according to one embodiment of the invention. In the embodiment illustrated, there are 32 vector registers 1510 that are 512 bits wide; these registers are referenced as zmm0 through zmm31. The lower order 256 bits of the lower 16 zmm registers are overlaid on registers ymm0-16. The lower order 128 bits of the lower 16 zmm registers (the lower order 128 bits of the ymm registers) are overlaid on registers xmm0-15. The specific vector friendly instruction format 1400 operates on these overlaid register file as illustrated in the below tables.

| Adjustable Vector Length | Class | Operations | Registers |
|---|---|---|---|
| Instruction Templates that do not include the vector length field 1359B | A (FIG. 13A; U = 0) | 1310, 1315, 1325, 1330 | zmm registers (the vector length is 64 byte) |
| | B (FIG. 13B; U = 1) | 1312 | zmm registers (the vector length is 64 byte) |
| Instruction Templates that do include the vector length field 1359B | B (FIG. 13B; U = 1) | 1317, 1327 | zmm, ymm, or xmm registers (the vector length is 64 byte, 32 byte, or 16 byte) depending on the vector length field 1359B |

In other words, the vector length field 1359B selects between a maximum length and one or more other shorter lengths, where each such shorter length is half the length of the preceding length; and instructions templates without the vector length field 1359B operate on the maximum vector length. Further, in one embodiment, the class B instruction templates of the specific vector friendly instruction format 1400 operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 1515—in the embodiment illustrated, there are 8 write mask registers (k0 through k7), each 64 bits in size. In an alternate embodiment, the write mask registers 1515 are 16 bits in size. As previously described, in one embodiment of the invention, the vector mask register k0 cannot be used as a write mask; when the encoding that would normally indicate k0 is used for a write mask, it selects a hardwired write mask of 0xFFFF, effectively disabling write masking for that instruction.

General-purpose registers 1525—in the embodiment illustrated, there are sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 1545, on which is aliased the MMX packed integer flat register file 1550—in the embodiment illustrated, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the invention may use wider or narrower registers. Additionally, alternative embodiments of the invention may use more, less, or different register files and registers.

FIGS. 16A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 16A is a block diagram of a single processor core, along with its connection to the on-die interconnect network 1602 and with its local subset of the Level 2 (L2) cache 1604, according to embodiments of the invention. In one embodiment, an instruction decoder 1600 supports the x86 instruction set with a packed data instruction set extension. An L1 cache 1606 allows low-latency accesses to cache memory into the scalar and vector units. While in one embodiment (to simplify the design), a scalar unit 1608 and a vector unit 1610 use separate register sets (respectively, scalar registers 1612 and vector registers 1614) and data transferred between them is written to memory and then read back in from a level 1 (L1) cache 1606, alternative embodiments of the invention may use a different approach (e.g., use a single register set or include a communication path that allow data to be transferred between the two register files without being written and read back).

The local subset of the L2 cache 1604 is part of a global L2 cache that is divided into separate local subsets, one per processor core. Each processor core has a direct access path to its own local subset of the L2 cache 1604. Data read by a processor core is stored in its L2 cache subset 1604 and can be accessed quickly, in parallel with other processor cores accessing their own local L2 cache subsets. Data written by a processor core is stored in its own L2 cache subset 1604 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 16B is an expanded view of part of the processor core in FIG. 16A according to embodiments of the invention. FIG. 16B includes an L1 data cache 1606A part of the L1 cache 1604, as well as more detail regarding the vector unit 1610 and the vector registers 1614. Specifically, the vector unit 1610 is a 16-wide vector processing unit (VPU) (see the 16-wide ALU 1628), which executes one or more of integer, single-precision float, and double-precision float instructions. The VPU supports swizzling the register inputs with swizzle unit 1620, numeric conversion with numeric convert units 1622A-B, and replication with replication unit 1624 on the memory input. Write mask registers 1626 allow predicating resulting vector writes.

Embodiments of the invention may include various steps, which have been described above. The steps may be embodied in machine-executable instructions which may be used to cause a general-purpose or special-purpose processor to perform the steps. Alternatively, these steps may be performed by specific hardware components that contain hard-wired logic for performing the steps, or by any combination of programmed computer components and custom hardware components.

As described herein, instructions may refer to specific configurations of hardware such as application specific integrated circuits (ASICs) configured to perform certain operations or having a predetermined functionality or software instructions stored in memory embodied in a non-transitory computer readable medium. Thus, the techniques shown in the figures can be implemented using code and data stored and executed on one or more electronic devices (e.g., an end station, a network element, etc.). Such electronic devices store and communicate (internally and/or with other electronic devices over a network) code and data using computer machine-readable media, such as non-transitory computer machine-readable storage media (e.g., magnetic disks; optical disks; random access memory; read only memory; flash memory devices; phase-change memory) and transitory computer machine-readable communication media (e.g., electrical, optical, acoustical or other form of propagated signals—such as carrier waves, infrared signals, digital signals, etc.). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). The storage device and signals carrying the network traffic respectively represent one or more machine-readable storage media and machine-readable communication media. Thus, the storage device of a given electronic device typically stores code and/or data for execution on the set of one or more processors of that electronic device. Of course, one or more parts of an embodiment of the invention may be implemented using different combinations of software, firmware, and/or hardware. Throughout this detailed description, for the purposes of explanation, numerous specific details were set forth in order to provide a thorough understanding of the present invention. It will be apparent, however, to one skilled in the art that the invention may be practiced without some of these specific details. In certain instances, well known structures and functions were not described in elaborate detail in order to avoid obscuring the subject matter of the present invention. Accordingly, the scope and spirit of the invention should be judged in terms of the claims which follow.

We claim:

1. A processor comprising:
vector compression logic to compress a source vector comprising a plurality of valid data elements and invalid data elements to generate a destination vector in which all of the valid data elements are stored contiguously on one side of the destination vector, wherein one side of the destination vector comprises contiguous bit positions that include either a most-significant or a least-significant bit position of the destination vector;
the vector compression logic to utilize a bit mask associated with the source vector and comprising a plurality of bits, each bit corresponding to one of the plurality of data elements of the source vector and indicating whether the data element comprises a valid data element or an invalid data element, the vector compression logic to utilize indices of the bit mask and associated bit values of the bit mask to generate a control vector; and
shuffle logic to shuffle/permute the data elements of the source vector to the destination vector in accordance with the control vector.

2. The processor as in claim 1 wherein the vector compression logic is to implement a plurality of levels of shift operations to generate the control vector based on the indices and bit values of the bit mask.

3. The processor as in claim 2 wherein for a source vector and a bit mask comprising N data elements and N bits, respectively, M levels of shift operations are to be implemented where $2^M=N$.

4. The processor as in claim 3 wherein N=64 and M=6.

5. The processor as in claim 3 wherein the vector compression logic is to initialize data elements of the control vector to be equal to the indices of the bit mask prior to implementing the shift operations and shifts the data elements of the control vector within each of the levels of shift operations.

6. The processor as in claim 5 wherein the levels of shift operations are to be arranged in order from Level 0 to Level M−1 and each shift level shifts specified control indices in a specified direction by an amount of $2^L$ where L is the current level, $0 \leq L < M-1$.

7. The processor as in claim 6 wherein the specified direction is towards regions of the control vector indexed by lower values.

8. The processor as in claim 6 wherein the data elements of the control vector to be shifted are identified based on a determined Zero Count (Z) value comprising the number of invalid data elements in the specified direction starting from a value of $n+2^L$ where n represents a current value of each data element of the current control vector.

9. The processor as in claim 8 wherein the value of $Z[n+2^L][L]$ is used to determine whether to shift, where [L] identifies a bit position within the zero count value for the value $Z[n+2^L]$.

10. The processor as in claim 9 wherein at each shift level, if $Z[n+2^L][L]=1$ then control[n]=control[$n+2^L$].

11. The processor as in claim 10 wherein the vector compression logic comprises a plurality of multiplexers to perform each level of shift operations.

12. The processor as in claim 11 wherein for each Level, L, a set of $N-2^L$ multiplexers are used to concurrently perform the shift operations.

13. The processor as in claim 12 wherein each multiplexer comprises a 2:1 multiplexer and wherein a value of $Z[n+2^L][L]$ is used as a control input to each multiplexer to determine whether to select a value of $n+2^L$ or a value of n.

14. A method comprising:
providing a source vector comprising N data elements and a bit mask having N bits identifying each data element as valid or invalid;
initializing a control vector to have data elements equal to indices of the bit mask;
performing shift operations to move all of the data elements of the control vector corresponding to valid data elements to one side of the control vector; and
shuffling/permuting the data elements of the source vector to a destination vector in accordance with the control vector.

15. The method as in claim 14 wherein performing shift operations comprises implementing a plurality of levels of shift operations to generate the control vector based on the indices and bit values of the bit mask.

16. The method as in claim 15 wherein for a source vector and a bit mask comprising N data elements and N bits, respectively, M levels of shift operations are to be implemented where $2^M=N$.

17. The method as in claim 16 wherein N=64 and M=6.

18. The method as in claim 16 further comprising:
initializing data elements of the control vector to be equal to the indices of the bit mask prior to implementing the shift operations and shifting the data elements of the control vector within each of the levels of shift operations.

19. The method as in claim 18 wherein the levels of shift operations are to be arranged in order from Level 0 to Level M−1 and each shift level shifts specified control indices in a specified direction by an amount of $2^L$ where L is the current level, $0 \leq L < M-1$.

20. The method as in claim 19 wherein the specified direction is towards regions of the control vector indexed by lower values.

21. The method as in claim 19 wherein the data elements of the control vector to be shifted are identified based on a determined Zero Count (Z) value comprising the number of invalid data elements in the specified direction starting from a value of $n+2^L$ where n represents a current value of each data element of the current control vector.

22. The method as in claim 21 wherein the value of $Z[n+2^L][L]$ is used to determine whether to shift, where [L] identifies a bit position within the zero count value for the value $Z[n+2^L]$.

23. The method as in claim 22 wherein at each shift level, if $Z[n+2^L][L]=1$ then $control[n]=control[n+2^L]$.

24. The method as in claim 23 wherein the vector compression logic comprises a plurality of multiplexers to perform each level of shift operations.

25. The method as in claim 24 wherein for each Level, L, a set of $N-2^L$ multiplexers are used to concurrently perform the shift operations.

26. The method as in claim 25 wherein each multiplexer comprises a 2:1 multiplexer and wherein a value of $Z[n+2^L][L]$ is used as a control input to each multiplexer to determine whether to select a value of $n+2^L$ or a value of n.

* * * * *